(12) United States Patent
Kuniyoshi et al.

(10) Patent No.: US 8,872,986 B2
(45) Date of Patent: Oct. 28, 2014

(54) DISPLAY DEVICE AND METHOD OF MANUFACTURING DISPLAY DEVICE

(75) Inventors: Tokuaki Kuniyoshi, Osaka (JP); Tomohiro Kimura, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 142 days.

(21) Appl. No.: 13/701,565

(22) PCT Filed: May 30, 2011

(86) PCT No.: PCT/JP2011/062371
§ 371 (c)(1),
(2), (4) Date: Dec. 3, 2012

(87) PCT Pub. No.: WO2011/152348
PCT Pub. Date: Dec. 8, 2011

(65) Prior Publication Data
US 2013/0077018 A1    Mar. 28, 2013

(30) Foreign Application Priority Data
Jun. 4, 2010   (JP) ................................. 2010-128902

(51) Int. Cl.
| | | |
|---|---|---|
| G02F 1/1335 | (2006.01) | |
| G02F 1/1333 | (2006.01) | |
| H01L 33/08 | (2010.01) | |
| G06F 3/041 | (2006.01) | |
| G06F 3/045 | (2006.01) | |
| H01L 33/58 | (2010.01) | |

(52) U.S. Cl.
CPC .............. *H01L 33/08* (2013.01); *G06F 3/0412* (2013.01); *G06F 3/045* (2013.01); *G02F 1/13338* (2013.01); *H01L 33/58* (2013.01)
USPC ................................ 349/12; 349/155; 349/58

(58) Field of Classification Search
CPC . G02F 1/13338; G02F 1/153; G02F 1/13392; G02F 1/13394; G02F 1/1343; G02F 2001/13312; G06F 3/045; G06F 3/0412; G06F 3/044
USPC ............................................... 349/12, 58, 155
See application file for complete search history.

(56) References Cited

U.S. PATENT DOCUMENTS 7,843,517 B2 *  11/2010  Hsieh et al. ...................... 349/12
8,031,275 B2 *  10/2011  Lee ................................. 349/12

(Continued)

FOREIGN PATENT DOCUMENTS

| JP | 06-28088 A | 2/1994 |
|---|---|---|
| JP | 10-116152 A | 5/1998 |

(Continued)

OTHER PUBLICATIONS

Official Communication issued in International Patent Application No. PCT/JP2011/062371, mailed on Aug. 30, 2011.

*Primary Examiner* — Mike Qi
(74) *Attorney, Agent, or Firm* — Keating & Bennett, LLP

(57) ABSTRACT

A display device includes a glass substrate, a glass substrate arranged at a distance from and opposite to the glass substrate, a lower electrode formed on the glass substrate, a counter electrode formed on the glass substrate opposite to the lower electrode, a spacer ball for supporting the glass substrate and the glass substrate to maintain a gap between the glass substrate and the glass substrate, and a plurality of conductive particles in particulate form arranged between the glass substrate and the glass substrate, a clearance being provided between the conductive particles positioned on the lower electrode and the counter electrode, the conductive particles positioned on the lower electrode being able to come into contact with the counter electrode when the glass substrate is pressed.

19 Claims, 49 Drawing Sheets

(56) References Cited

U.S. PATENT DOCUMENTS

2008/0055502 A1* 3/2008 Wu et al. .................... 349/38
2010/0079396 A1* 4/2010 Sasaki et al. ................ 345/173
2011/0001723 A1* 1/2011 Fan .............................. 345/174
2011/0193815 A1   8/2011 Tanabe et al.

FOREIGN PATENT DOCUMENTS

| JP | 2007-58071 A | 3/2007 |
| JP | 2008-65302 A | 3/2008 |
| JP | 2010-85435 A | 4/2010 |
| WO | 20091139097 A1 | 11/2009 |

* cited by examiner

DISPLAY DEVICE AND METHOD OF MANUFACTURING DISPLAY DEVICE

TECHNICAL FIELD

The present invention relates to a display device and a method of manufacturing the display device, and more particularly to a display device with a touch panel function and a method of manufacturing the display device.

BACKGROUND ART

A variety of display devices having a touch sensor have been conventionally proposed. Such a display device includes, for example, an array substrate, a counter substrate arranged above the array substrate, a plurality of columnar spacers provided between the counter substrate and the array substrate, and a switch unit formed on the lower surface of the counter substrate. The spacers are made of an elastically deformable resin, and are members for maintaining a constant cell thickness between the array substrate and the counter substrate.

The switch unit includes a projection projecting from the lower surface of the counter substrate toward the array substrate, a counter electrode formed to cover the projection, and a lower electrode formed on the array substrate.

The projection is formed by arranging a resin or the like on the counter substrate, and subsequently patterning the resin. The projection has a height lower than that of the spacers, and the counter electrode positioned on the projection and the lower electrode are spaced apart from each other when the counter substrate is not being pressed. When pressed by a user, the counter substrate sags and the spacers are elastically deformed, causing the counter electrode positioned on the projection to come into contact with the lower electrode.

In such a display device with a touch panel function, the projection needs to be formed with an accurate height. Unfortunately, in the process of forming the projection, it is difficult to form a resin of a uniform thickness on the surface of the counter substrate, and slumping tends to occur during patterning of the formed resin. It is thus difficult to form the projection with an accurate height, and the formed projections tend to vary in height. The height variation among the projections may make it difficult for the switches to function, or may cause the switches to be turned on even if the counter substrate is not being pressed, for example, resulting in difficulty in ensuring reliability of the switches.

The projection is formed by patterning the resin as described above, and the peripheral surface of the projection rises to be substantially perpendicular to the array substrate. When the counter electrode is formed on the surface of the projection, the counter electrode may be torn.

A display device aiming to suppress such tear of a counter electrode has been proposed. For example, a liquid crystal display device described in Japanese Patent Laying-Open No. 2007-58071 (PTL 1) includes an array substrate, a counter substrate provided above the array substrate, and a plurality of touch sensors provided on the upper surface of the array substrate.

The touch sensors each include an insulative tubular sensor projection, and a conductive layer formed within the sensor projection. The conductive layer has a lower end portion connected to a pixel electrode. The conductive layer has an upper end portion which is recessed from an opening of the tubular sensor projection toward the inside of the sensor projection.

The sensor projection has an upper end portion in contact with the counter substrate, and is made of an elastically deformable material. When the counter substrate is pressed, a cell thickness between the array substrate and the counter substrate is reduced and the sensor projection is elastically deformed, causing the upper end portion of the conductive layer to come into contact with a counter electrode formed on the counter substrate.

CITATION LIST

Patent Literature

PTL 1: Japanese Patent Laying-Open No. 2007-58071

SUMMARY OF INVENTION

Technical Problem

In the liquid crystal display device described in Japanese Patent Laying-Open No. 2007-58071, the sensor projection needs to be formed with an accurate height, and an accurate filling amount of the conductive layer needs to be formed. In addition, a hole of the sensor projection needs to be accurately filled with the conductive layer, in such a manner that the conductive layer does not reach the opening of the sensor projection.

In the liquid crystal display device described in Japanese Patent Laying-Open No. 2007-58071, therefore, manufacturing variations tend to occur with a very low yield.

The present invention was made in view of such problems as described above, and an object of the present invention is to provide a display device with a touch panel function, which is capable of achieving suppressed manufacturing variations with an improved yield, and a method of manufacturing the display device.

Solution to Problem

A display device according to the present invention includes a first substrate, a second substrate arranged at a distance from and opposite to the first substrate, a first electrode formed on the first substrate, a second electrode formed on the second substrate opposite to the first electrode. The display device includes a support member for supporting the first substrate and the second substrate to maintain a gap between the first substrate and the second substrate, and a plurality of conductive members in particulate form arranged between the first substrate and the second substrate. A clearance is provided between the conductive members positioned on the first electrode and the second electrode, and the conductive members positioned on the first electrode are able to come into contact with the second electrode when the second substrate is pressed.

Preferably, each of the conductive members includes an elastically deformable core portion, and a conductive film covering a surface of the core portion. Preferably, the support member is an insulating member in particulate form arranged between the first substrate and the second substrate, the insulating member having a particle size larger than that of the conductive members.

Preferably, the display device further includes a first insulating film formed on the first substrate to expose at least a part of the first electrode. The conductive members include a first conductive member arranged on the part of the first electrode which is exposed through the first insulating film, and arranged at a distance from the second electrode, and a second conductive member arranged on the first insulating film, and supporting the first substrate and the second substrate. The support member includes the first insulating film and the second conductive member. The first conductive member is able to come into contact with the second electrode when the second substrate is pressed. Preferably, the first insulating film is an alignment film provided on the first substrate.

Preferably, the display device further includes a second insulating film formed on the second substrate to expose at least a part of the second electrode. The conductive members include a third conductive member positioned below the part of the second electrode which is exposed through the second insulating film, and arranged on the first electrode, and a fourth conductive member arranged between the second insulating film and the first substrate, and supporting the first substrate and the second substrate. The support member includes the second insulating film and the fourth conductive member. The third conductive member is able to come into contact with the second electrode when the second substrate is pressed.

Preferably, the conductive members arranged on the first electrode are fixed on the first electrode. Preferably, the display device further includes a color filter having a light-blocking black matrix and a color layer. The first electrode and the black matrix are arranged in a direction in which the first substrate and the second substrate are stacked.

Preferably, the display device further includes an active matrix substrate having the first substrate and the first electrode. The active matrix substrate includes a display area provided with a plurality of switching elements, and a non-display area. The first electrode and the conductive members are provided in the display area.

Preferably, the display device further includes an active matrix substrate having the first substrate and the first electrode. The active matrix substrate includes a display area provided with a plurality of switching elements, and a non-display area. The first electrode and the conductive members are provided in the non-display area.

Preferably, the display device further includes a liquid crystal layer arranged between the first substrate and the second substrate, and a sealing member arranged between the first substrate and the second substrate and sealing the liquid crystal layer between the first substrate and the second substrate. The first electrode and the conductive members are arranged in a region surrounded by the sealing member.

Preferably, the display device further includes a liquid crystal layer arranged between the first substrate and the second substrate, and a sealing member arranged between the first substrate and the second substrate and sealing the liquid crystal layer between the first substrate and the second substrate. The first electrode and the conductive members are arranged outside of the sealing member.

A method of manufacturing a display device according to the present invention includes the steps of preparing a first substrate having a first main surface, forming a first electrode on the first main surface, preparing a second substrate having a second main surface, forming a second electrode on the second main surface, arranging conductive members in particulate form on the first substrate having the first electrode formed thereon, so that the conductive members are arranged on the first electrode, and bonding the first substrate and the second substrate together so that the first main surface and the second main surface are opposite to each other. The conductive members arranged on the first electrode are arranged at a distance from the second electrode when the first substrate and the second substrate are bonded together.

Preferably, the step of arranging conductive members includes the steps of applying a solvent having the conductive members mixed therein to the first substrate, and patterning the solvent applied to the first substrate to form a pattern film remaining on the first electrode.

Preferably, the method further includes the steps of forming a resist film on the first substrate having the first electrode formed thereon, and patterning the resist film to form a resist pattern film provided with an opening through which at least a part of the first electrode is exposed. The step of arranging conductive members includes the steps of distributing the conductive members so that the conductive members are positioned in the opening and on the resist pattern film, fixing the conductive members positioned in the opening onto the first electrode, and removing the resist pattern film and the conductive members positioned on the resist pattern film.

Preferably, each of the conductive members includes a resin layer provided on its surface, and a conductive layer positioned on the inner side of the resin layer, and the step of fixing the conductive members includes the step of heating the conductive members positioned in the opening.

Preferably, the method further includes the steps of forming a first insulating film on the first substrate having the first electrode formed thereon, and patterning the first insulating film to form a first pattern insulating film provided with an opening through which at least a part of the first electrode is exposed. In the step of arranging conductive members, the conductive members are arranged in the opening and on the first pattern insulating film.

Preferably, the method further includes the step of subjecting the first pattern insulating film to a rubbing process to form an alignment film.

Preferably, the method further includes the steps of forming a second insulating film on the second electrode, and patterning the second insulating film to expose a part of the second electrode.

Advantageous Effects of Invention

According to the display device with a touch panel function and the method of manufacturing the display device of the present invention, manufacturing variations can be suppressed to improve yields.

DESCRIPTION OF EMBODIMENTS

Referring to FIGS. 1 to 51, a display device and a method of manufacturing the display device according to the present invention will be described. Whenever any reference is made to a number, an amount and the like in embodiments described below, the scope of the present invention is not necessarily limited to that number, amount and the like unless otherwise specified. Moreover, in the following embodiments, each constituent element is not necessarily an essential element of the present invention unless otherwise specified. Furthermore, if there are a plurality of embodiments below, it is originally intended to combine features of the embodiments together as appropriate unless otherwise specified.

First Embodiment

Figure 1:
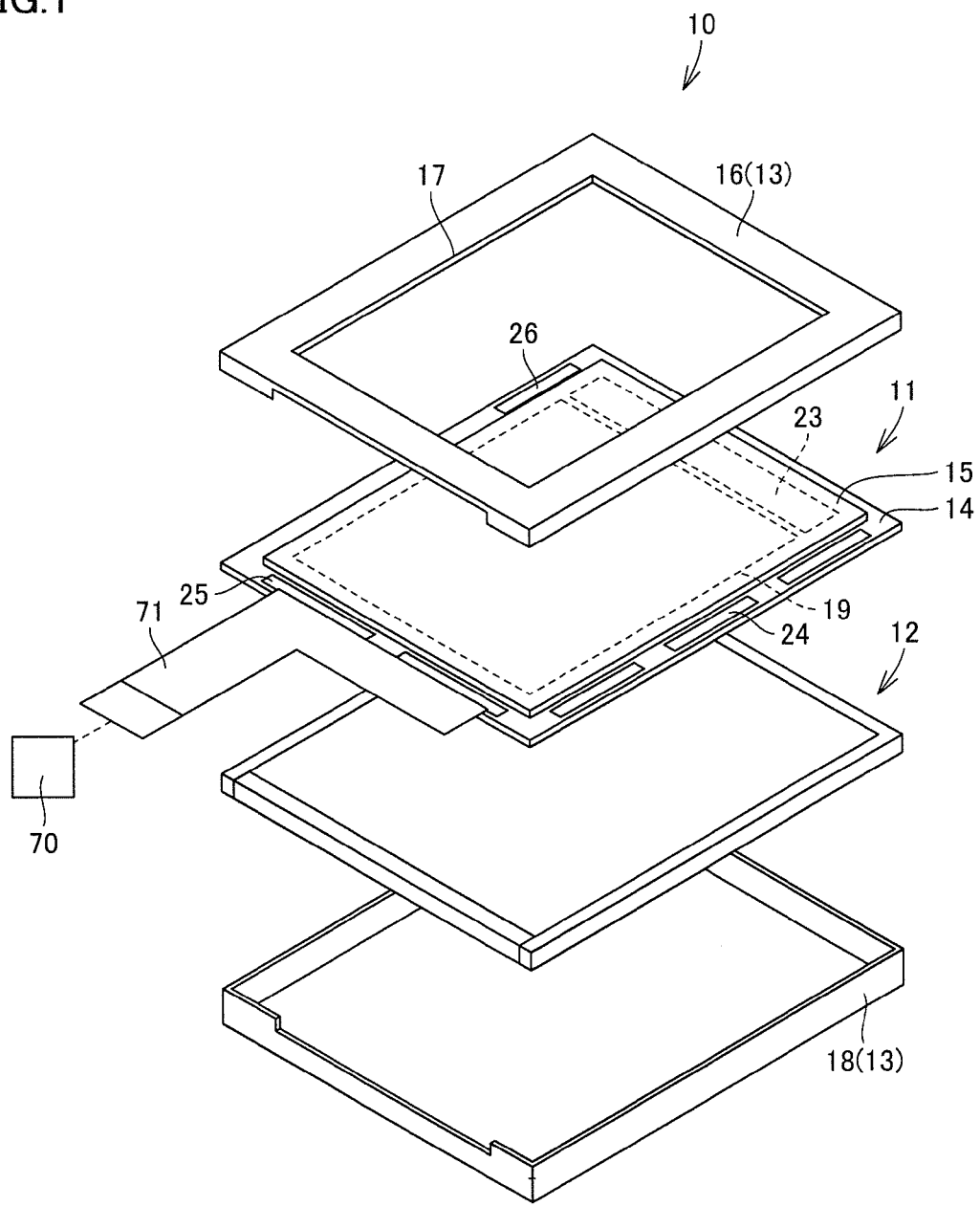
FIG. 1 is an exploded perspective view of a display device 10 according to a first embodiment.

FIG. 1 is an exploded perspective view of a display device 10 according to a first embodiment. Display device 10 includes a display unit 11, a backlight 12 for emitting light to display unit 11, and a housing 13 for holding display unit 11 and backlight 12.

Display unit 11 includes an active matrix substrate 14, and a counter substrate 15 arranged on active matrix substrate 14.

Display unit 11 includes a display area where an image is displayed, a non-display area around the display area where an image is not displayed, and a connection area around the non-display area.

A not-shown polarizing plate is arranged on the upper surface of counter substrate 15, and a not-shown polarizing plate is also arranged on the lower surface of active matrix substrate 14. The polarizing plates are arranged so that the oscillation direction of light transmitted through the polarizing plate arranged on the upper surface of counter substrate 15 is orthogonal to the oscillation direction of light transmitted through the polarizing plate arranged on the lower surface of active matrix substrate 14.

Housing 13 includes a front surface unit 16 provided with an opening 17, and a rear surface unit 18. Opening 17 is a window portion that opens the display area of display unit 11 to the outside. A viewer can view an image displayed in the display area through opening 17.

Figure 2:
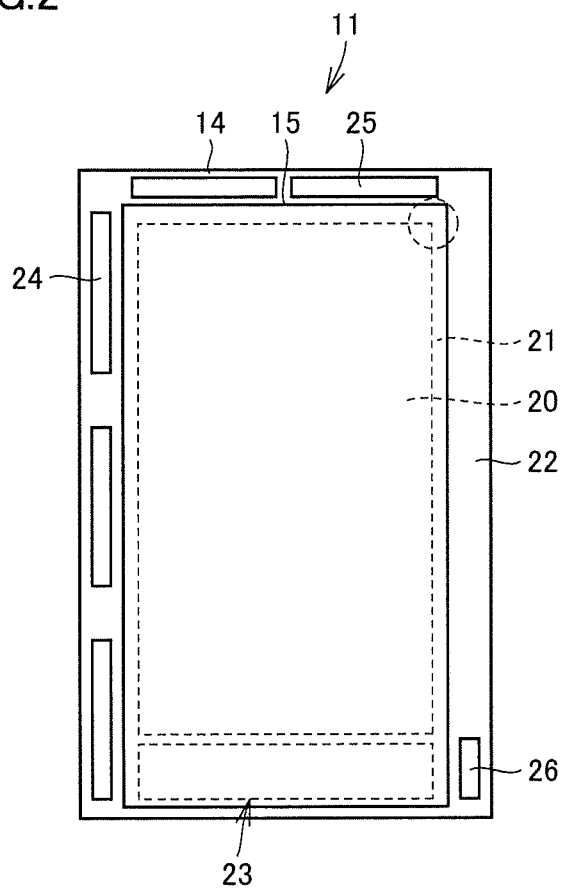
FIG. 2 is a plan view schematically showing an active matrix substrate 14.

FIG. 2 is a plan view schematically showing active matrix substrate 14. Display unit 11 includes a display area 20, a non-display area 21 around display area 20, and a connection area 22 around non-display area 21.

Display area 20 and non-display area 21 are positioned in a portion where active matrix substrate 14 and counter substrate 15 are placed on one another. In connection area 22, the upper surface of active matrix substrate 14 is not covered with counter substrate 15, but is exposed to the outside. In a portion of the upper surface of active matrix substrate 14 where connection area 22 is positioned, a gate driver 24, a source driver 25 and a sensor driver 26 are provided. An operation area 23 operated by a user is provided in non-display area 21.

Figure 3:
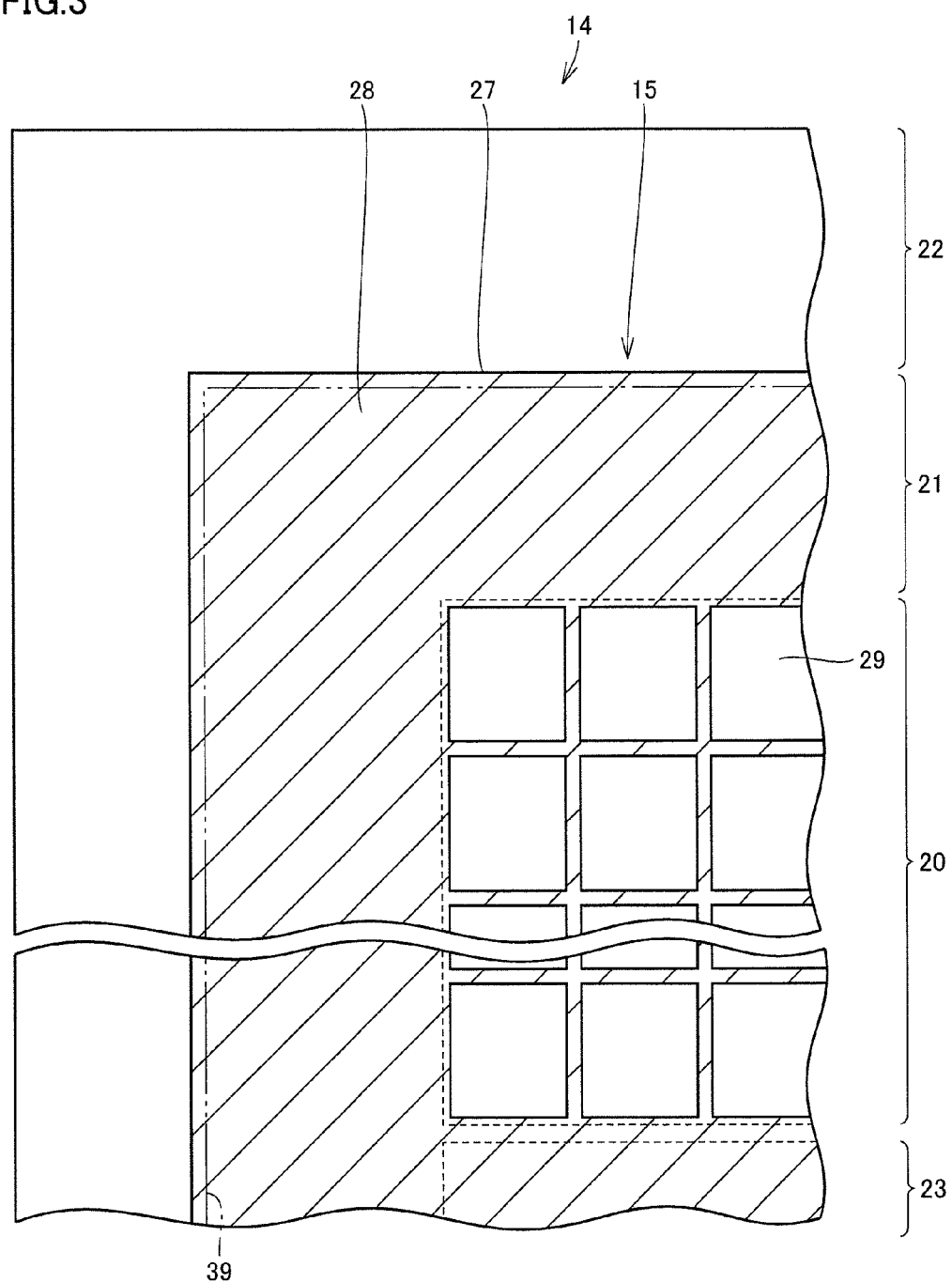
FIG. 3 is a plan view showing an enlarged part of active matrix substrate 14.

FIG. 3 is a plan view showing an enlarged part of active matrix substrate 14. In FIG. 3, counter substrate 15 includes a color filter 27, which includes a light-blocking black matrix 28 and a plurality of color layers 29. In the example shown in FIG. 3, black matrix 28 is arranged in a lattice form to form a plurality of window portions. Color layers 29 are formed in the window portions.

In a portion of color filter 27 where display area 20 is positioned, the plurality of color layers 29 are formed. In a portion of color filter 27 where non-display area 21 is positioned, black matrix 28 is formed. A liquid crystal layer is enclosed between counter substrate 15 and active matrix substrate 14, and an annular sealing member 39 is arranged at an outer peripheral edge portion of counter substrate 15.

Figure 4:
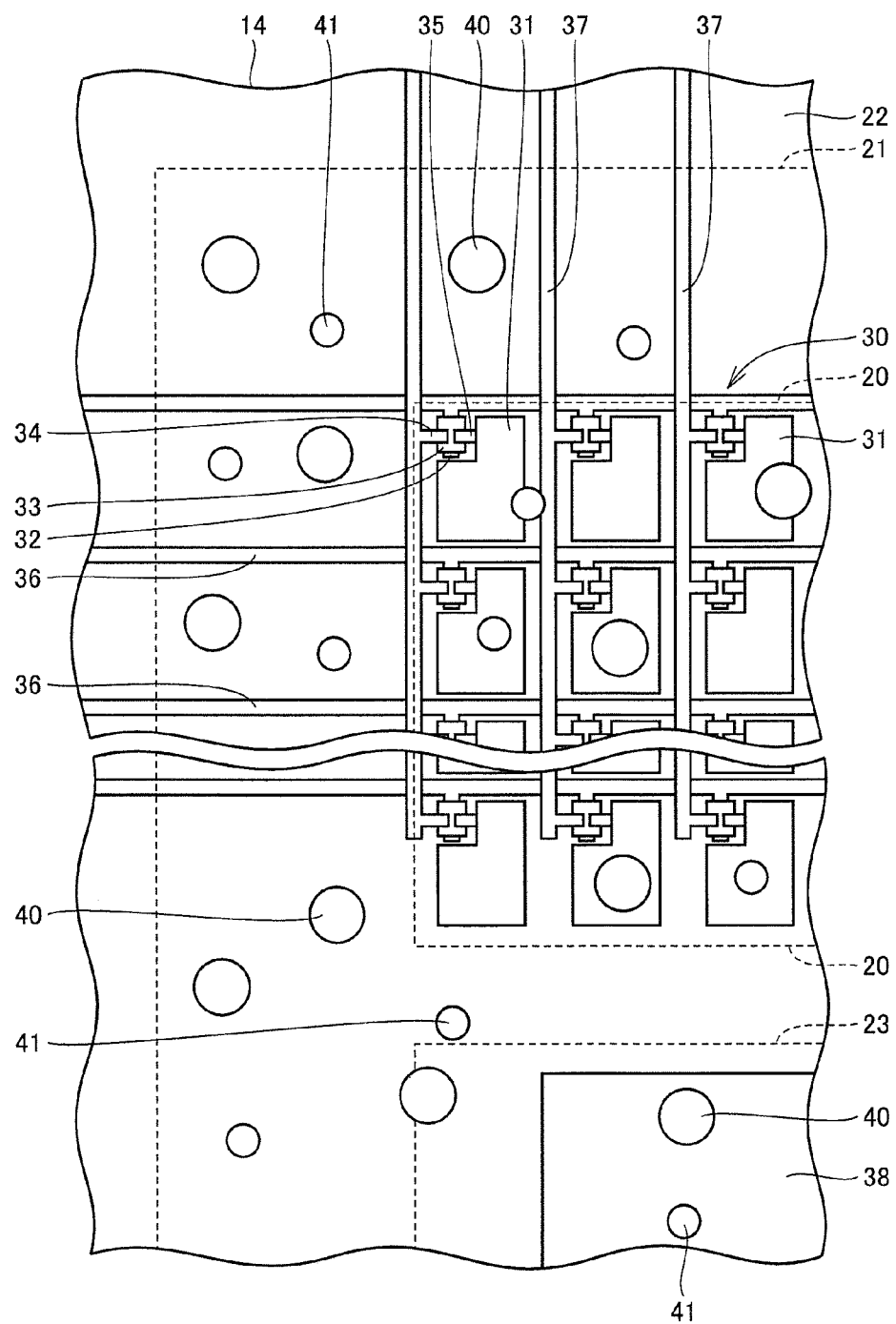
FIG. 4 is a plan view showing a part of active matrix substrate 14, after a color filter 27 was removed from the plan view of FIG. 3.

FIG. 4 is a plan view showing a part of active matrix substrate 14, after color filter 27 was removed from the plan view of FIG. 3. As shown in FIG. 4, a plurality of spacer balls 40 and a plurality of conductive particles 41 are distributed on the upper surface of active matrix substrate 14.

A plurality of gate lines 36 and a plurality of source lines 37 are provided on the upper surface of active matrix substrate 14. Gate lines 36 extend in a first direction and are arranged at a distance from one another in a second direction, while source lines 37 extend in the second direction and are arranged at a distance from one another in the first direction.

Gate lines 36 are extended to the outer peripheral edge of active matrix substrate 14, with gate pad units formed at the end portions of gate lines 36. Gate driver 24 shown in FIG. 2 is connected to the gate pad units, and is connected to a control unit 70 via a printing line 71 shown in FIG. 1. Source lines 37 are extended to the outer peripheral edge of active matrix substrate 14, with source pad units formed at the end portions of source lines 37. Source driver 25 is connected to the source pad units, and is connected to control unit 70 via printing line 71. Sensor driver 26 is also connected to control unit 70 via printing line 71.

In a portion of the upper surface of active matrix substrate 14 where display area 20 is positioned, a plurality of TFT transistors (thing film transistors) 30 and pixel electrodes 31 connected to TFT transistors 30, respectively, are arranged.

Each of TFT transistors 30 includes a gate electrode 32, a semiconductor layer 33 formed on gate electrode 32, and a source electrode 34 and a drain electrode 35 formed on semiconductor layer 33. Pixel electrode 31 is connected to drain electrode 35. Gate electrode 32 is connected to gate line 36, and source electrode 34 is connected to source line 37.

In a portion of the upper surface of active matrix substrate 14 where operation area 23 is positioned, a lower electrode 38 is provided. Spacer balls 40 and conductive particles 41 are distributed on the upper surface of lower electrode 38 as well.

Figure 5:
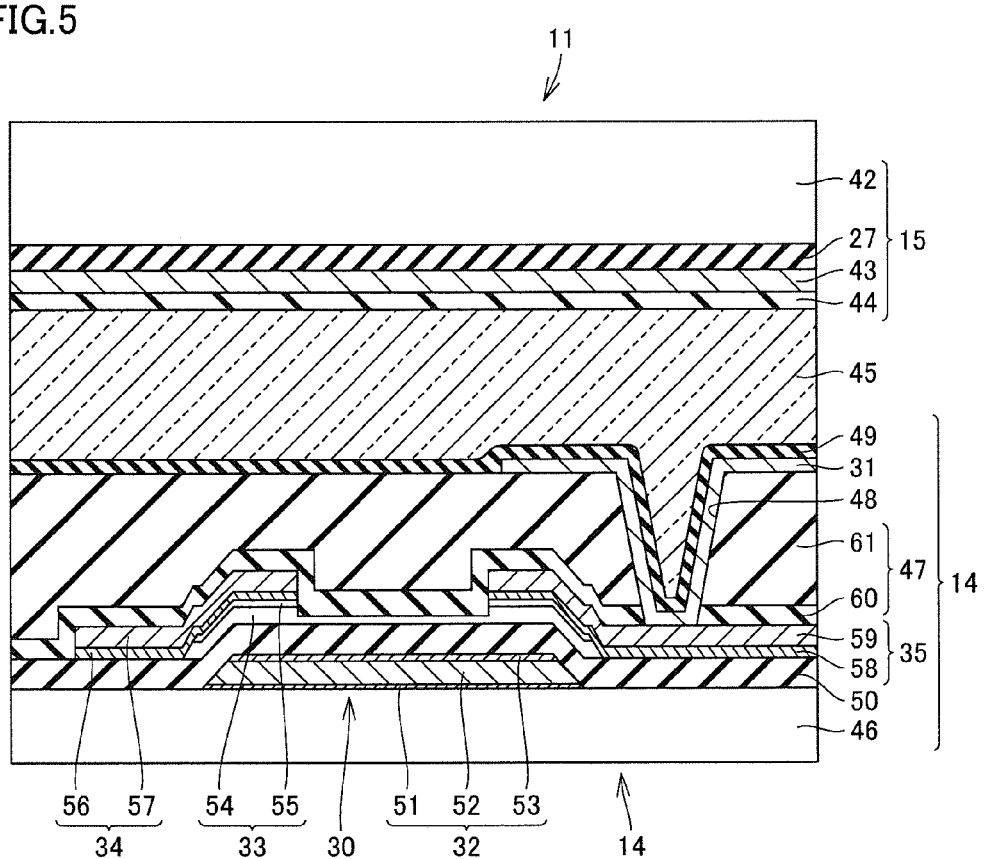
FIG. 5 is a cross-sectional view of a display unit 11, showing a cross section of a TFT transistor 30.

FIG. 5 is a cross-sectional view of display unit 11, showing a cross section of TFT transistor 30. As shown in FIG. 5, a liquid crystal layer 45 is enclosed between counter substrate 15 and active matrix substrate 14.

Counter substrate 15 includes a glass substrate 42, color filter 27, a counter electrode 43, and an alignment film 44. Color filter 27 is formed on the main surface of glass substrate 42 opposite to active matrix substrate 14, and counter electrode 43 is formed on the main surface of color filter 27 opposite to active matrix substrate 14.

Alignment film 44 is formed on the main surface of counter electrode 43 opposite to active matrix substrate 14. Alignment film 44 is made of an insulative material.

Active matrix substrate 14 includes a glass substrate 46, TFT transistor 30 formed on the main surface of glass substrate 46, an interlayer insulating film 47 formed to cover TFT transistor 30, pixel electrode 31 formed on the inner peripheral surface of a contact hole 48 formed in interlayer insulating film 47 and on the upper surface of interlayer insulating film 47, and an alignment film 49 formed on the upper surface of pixel electrode 31. A part of the upper surface of drain electrode 35 is exposed through interlayer insulating film 47 by contact hole 48, and pixel electrode 31 is connected to drain electrode 35.

TFT transistor 30 includes gate electrode 32 formed on the main surface of glass substrate 46, a tunnel insulating film 50 formed on the main surface of glass substrate 46 to cover gate electrode 32, semiconductor layer 33 formed in a portion of the upper surface of tunnel insulating film 50 which is positioned above gate electrode 32, and drain electrode 35 and source electrode 34 formed on semiconductor layer 33.

Gate electrode 32 includes a metallic film 51 made of titanium (Ti) and formed on the main surface of glass substrate 46, a metallic film 52 made of aluminum (Al) and formed on the upper surface of metallic film 51, and a metallic film 53 made of titanium and formed on the upper surface of metallic film 52. Tunnel insulating film 50 is made of silicon nitride (SiNx: x being a positive number), for example.

Semiconductor layer 33 includes a high-resistance semiconductor layer (i layer) 54 made of amorphous silicon, polysilicon or the like, and a low-resistance semiconductor layer (n+ layer) 55 made of n+ amorphous silicon or the like doped with an impurity and formed on high-resistance semiconductor layer 54.

Source electrode 34 includes a metallic layer 56 made of titanium or the like, and a metallic layer 57 made of aluminum or the like and formed on the upper surface of metallic layer 56. Drain electrode 35 likewise includes a metallic layer 58 made of titanium, and a metallic layer 59 made of aluminum and formed on metallic layer 58.

Interlayer insulating film 47 includes a protective film 60, and a flattened film 61 formed on the upper surface of protective film 60. Protective film 60 is formed of a silicon nitride film, and flattened film 61 is made of an organic material such as an acrylic-based synthetic resin. Pixel electrode 31 is made of a conductive material such as ITO (Indium Tin Oxide). Alignment film 49 is made of an insulative material.

Figure 6:
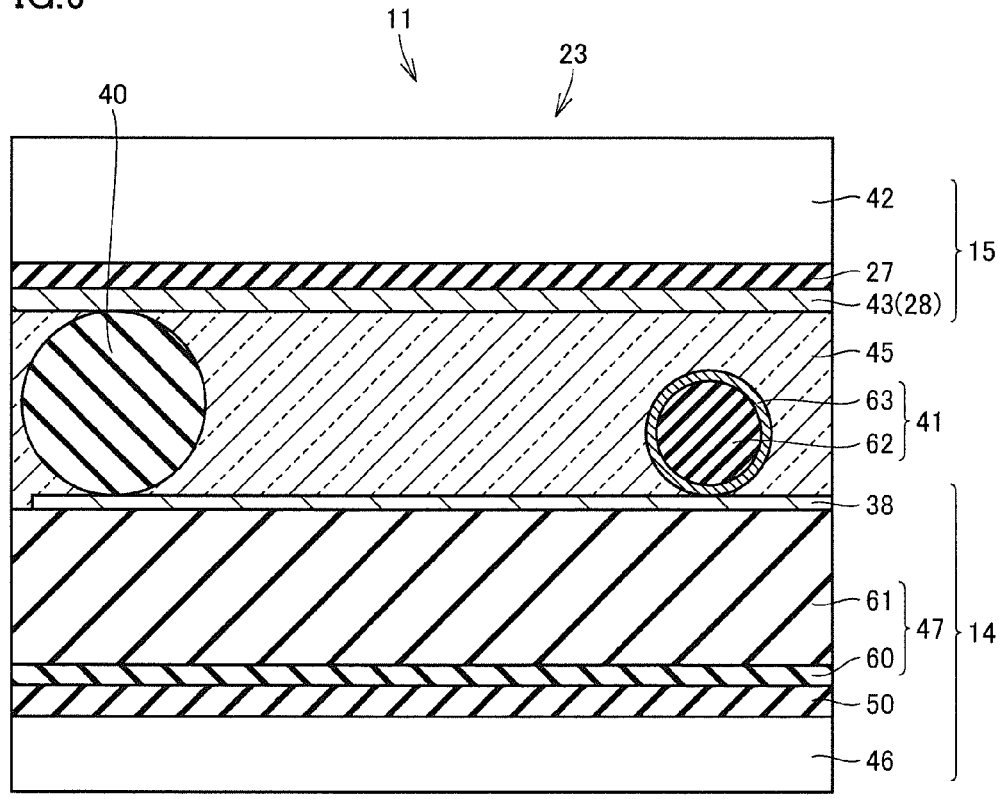
FIG. 6 is a cross-sectional view of display unit 11 in an operation area 23.

FIG. 6 is a cross-sectional view of display unit 11 in operation area 23. As shown in FIG. 6, tunnel insulating film 50 and interlayer insulating film 47 are successively formed on the main surface of glass substrate 46 in operation area 23. Lower electrode 38 is formed on the upper surface of interlayer insulating film 47. Lower electrode 38 is formed of a conductive film such as an ITO film.

Counter electrode 43 is provided above and opposite to lower electrode 38. In a portion of color filter 27 which is positioned above lower electrode 38, black matrix 28 is positioned.

Spacer ball 40 and conductive particle 41 are arranged on the upper surface of lower electrode 38. Spacer ball 40 is made of an elastically deformable insulative resin such as polystyrene resin, acrylic resin, melamine resin, or urea resin.

Spacer ball 40 is in contact with both of active matrix substrate 14 and counter substrate 15. Spacer ball 40 supports both of active matrix substrate 14 and counter substrate 15, to maintain a constant cell gap between active matrix substrate 14 and counter substrate 15.

Conductive particle 41 is formed in particulate form. Although it is formed in a spherical shape in the example shown in FIG. 6, conductive particle 41 may be formed in the shape of a grain of rice or the shape of a rugby ball, for example.

Conductive particle 41 includes a core portion 62 made of an elastically deformable resin, and a conductive film 63 formed on the surface of core portion 62. Core portion 62 is made of polystyrene resin, acrylic resin, melamine resin, or urea resin, for example. Conductive film 63 is made of a metallic material such as copper or aluminum, and is formed by plating core portion 62.

Conductive particle 41 in particulate form has an outer diameter smaller than the outer diameter of spacer ball 40. When counter substrate 15 is not being pressed, therefore, there is a clearance between conductive particle 41 positioned on lower electrode 38 and counter electrode 43.

Conductive particles 41 to be distributed on the upper surface of active matrix substrate 14 are passed through a sieve in advance, to ensure that conductive particles 41 distributed on the upper surface of active matrix substrate 14 have a uniform diameter. In particular, by passing conductive particles 41 through a plurality of sieves in advance, variation in outer diameter of conductive particles 41 can be suppressed.

Spacer balls 40 are likewise passed through a sieve before being distributed on the upper surface of active matrix substrate 14, to ensure that spacer balls 40 distributed on the upper surface of active matrix substrate 14 have a uniform diameter. Spacer balls 40 may be formed in a spherical shape, the shape of a grain of rice, or the shape of a rugby ball, for example.

Since conductive particles 41 and spacer balls 40 have such highly accurate outer diameters, the occurrence of variation in distance between conductive particles 41 positioned on the upper surface of lower electrode 38 and counter electrode 43 can be suppressed.

Figure 7:
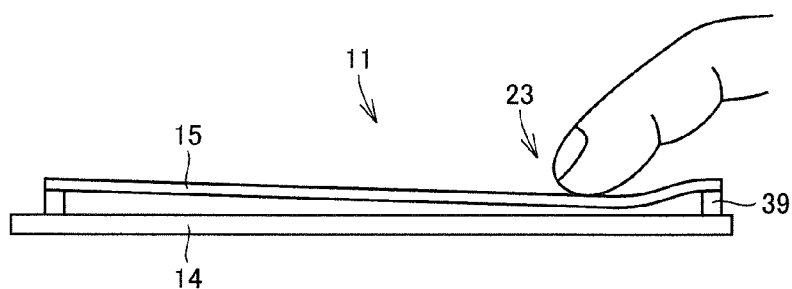
FIG. 7 is a cross-sectional view schematically showing a state where a user presses the upper surface of a counter substrate 15.

FIG. 7 is a cross-sectional view schematically showing a state where the user presses the upper surface of counter substrate 15. In FIG. 7, sealing member 39 arranged at the outer periphery of counter substrate 15 is made of a deformation-resistant material. When the user presses a portion of operation area 23, the entire counter substrate 15 is deformed in a sagging manner. In particular, the portion of display unit 11 that has been pressed by the finger and a portion in the vicinity thereof sag significantly.

Figure 8:
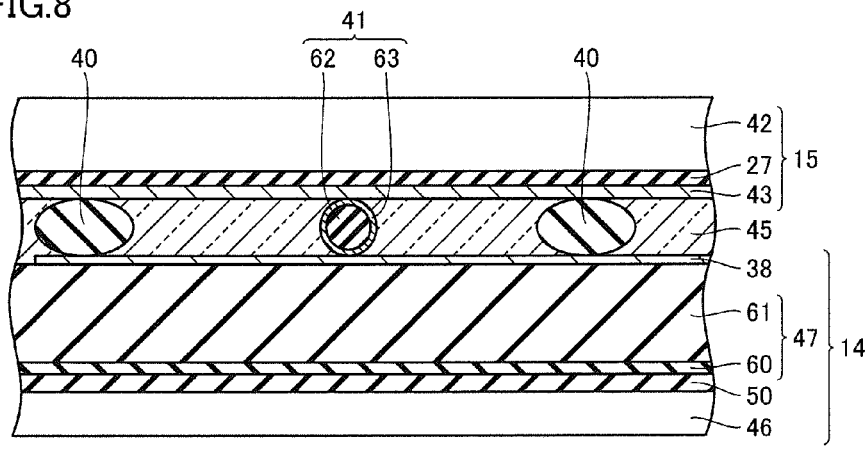
FIG. 8 is a cross-sectional view of operation area 23 when the user presses a portion of display unit 11 where operation area 23 is positioned.

FIG. 8 is a cross-sectional view of operation area 23 when the user presses the portion of display unit 11 where operation area 23 is positioned.

As shown in FIG. 8, when pressed by the user, spacer balls 40 are elastically deformed to reduce the cell thickness, and counter substrate 15 moves closer to active matrix substrate 14.

The downward movement of counter substrate 15 arranged on the upper surface of lower electrode 38 causes conductive particles 41 positioned on lower electrode 38 to come into contact with counter electrode 43.

When conductive particles 41 come into contact with counter electrode 43, a current flows between counter electrode 43 and lower electrode 38 through conductive particles 41. Lower electrode 38 is connected to sensor driver 26 shown in FIG. 1. When a current flows between lower electrode 38 and counter electrode 43, control unit 70 senses the current. In this manner, when the portion of display unit 11 where operation area 23 is positioned is pressed, control unit 70 can sense that the portion where operation area 23 is positioned has been pressed.

Since the occurrence of variation in diameter of conductive particles 41 is suppressed as described above, the contact between conductive particles 41 and counter electrode 43 can be prevented when counter substrate 15 is not being pressed. Furthermore, since the occurrence of variation in distance between conductive particles 41 positioned on lower electrode 38 and counter electrode 43 is suppressed as described above, when the user presses counter substrate 15 with a prescribed pressing force, conductive particles 41 positioned on the upper surface of lower electrode 38 can be brought into contact with counter electrode 43.

Figure 9:
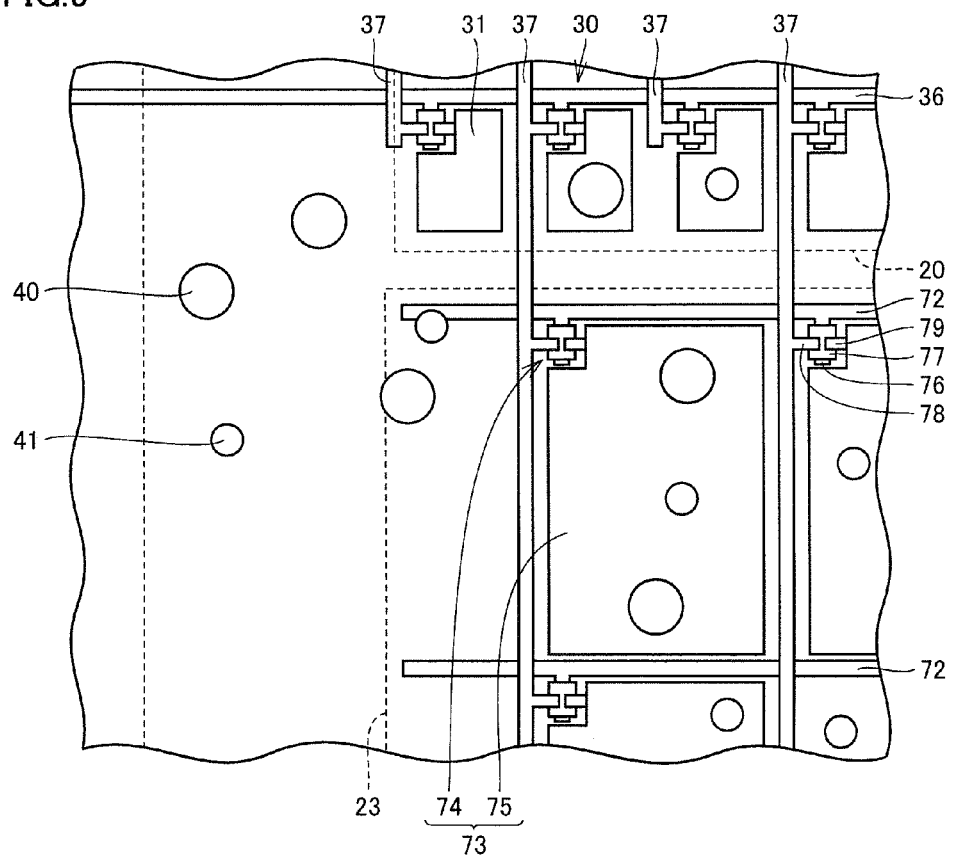
FIG. 9 is a plan view showing a part of a modified example of display device 10 according to the first embodiment.
Figure 10:
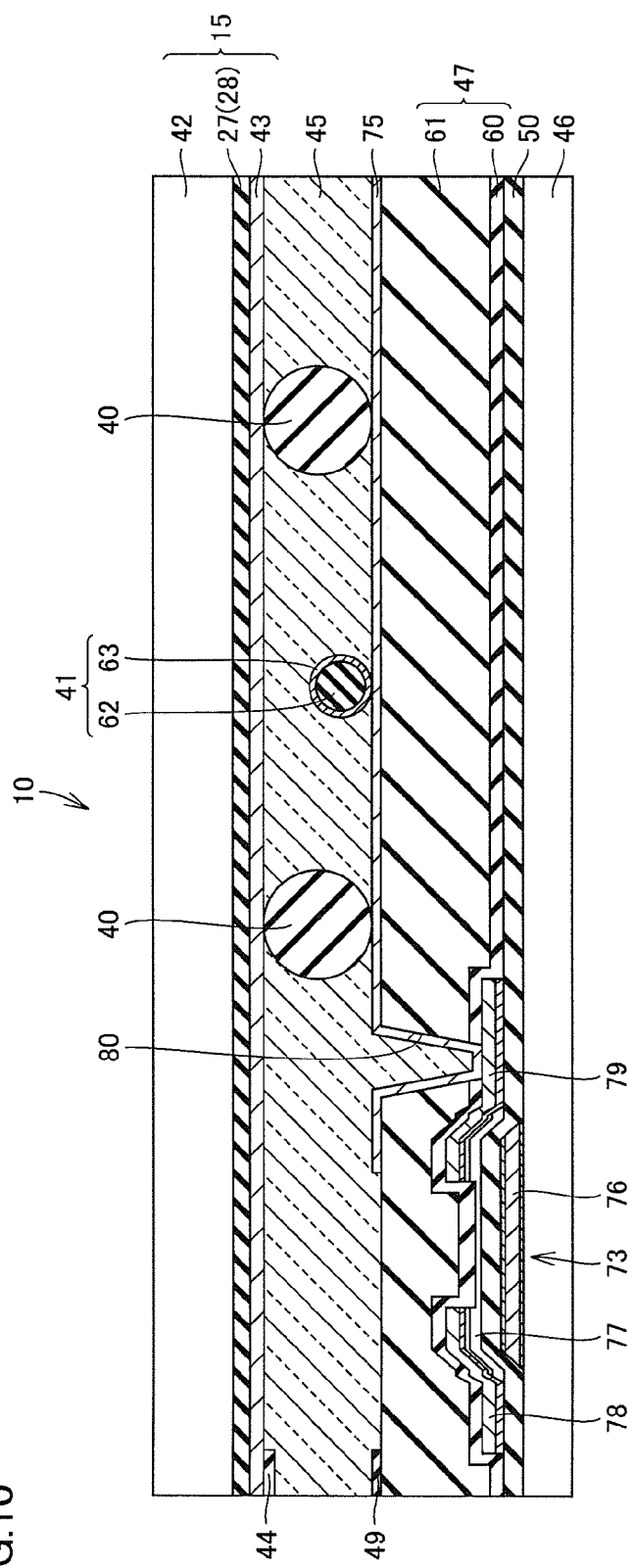
FIG. 10 is a cross-sectional view showing a sensor element 73 and its surrounding structure.

Referring to FIGS. 9 and 10, a modified example of display device 10 according to the first embodiment is described. FIG. 9 is a plan view showing a part of the modified example of display device 10 according to the first embodiment.

In the example shown in FIG. 9, some of the plurality of source lines 37 are formed to pass through operation area 23.

In operation area 23, a plurality of sensor lines 72 are formed to extend parallel to gate lines 36. A plurality of sensor elements 73 are provided in operation area 23. Each of sensor elements 73 includes a selection transistor 74, a lower electrode 75 connected to the drain electrode of selection transistor 74, and counter electrode 43 formed on counter substrate 15.

FIG. 10 is a cross-sectional view showing sensor element 73 and its surrounding structure. As shown in FIGS. 10 and 9, selection transistor 74 has a structure similar to that of TFT transistor 30. Specifically, selection transistor 74 includes a gate electrode 76 formed on the main surface of glass substrate 46, tunnel insulating film 50 formed to cover the upper surface of gate electrode 76, a semiconductor layer 77 formed on the upper surface of tunnel insulating film 50, and a source electrode 78 and a drain electrode 79 formed on the upper surface of semiconductor layer 77.

Interlayer insulating film 47 is provided with contact hole 80, with drain electrode 79 being exposed through the bottom of contact hole 80. Lower electrode 75 is formed on the inner peripheral surface of contact hole 80, the upper surface of drain electrode 79 in contact hole 80, and the upper surface of interlayer insulating film 47. Gate electrode 76 is connected to sensor line 72 shown in FIG. 9, and source electrode 78 is connected to source line 37. Sensor lines 72 are connected to sensor driver 26 shown in FIG. 1.

In operation area 23, alignment film 49 is not formed on the upper surface of lower electrode 75, and alignment film 44 is not formed on the lower surface of counter electrode 43. In a portion of color filter 27 which is positioned above lower electrode 75, black matrix 28 is positioned. Spacer balls 40 and conductive particles 41 are arranged on the upper surface of lower electrode 75.

Control unit 70 switches between on and off states of each sensor element 73 in a time sharing manner, to select a particular one of lower electrodes 75.

For example, when counter substrate 15 is pressed to cause conductive particles 41 positioned on selected lower electrode 75 to come into contact with counter electrode 43, control unit 70 can sense that conductive particles 41 have come into contact with counter substrate 15 above selected lower electrode 75.

Although lower electrode 75 is formed to be larger than pixel electrode 31 in the example shown in FIGS. 9 and 10, lower electrode 75 may be formed with a size similar to that of pixel electrode 31, or may be formed to be smaller than pixel electrode 31 shown in FIGS. 9 and 10.

Referring to FIGS. 11 to 19, a method of manufacturing display device 10 shown in FIG. 10 is described. When manufacturing display device 10, active matrix substrate 14 and counter substrate 15 are fabricated in separate manufacturing processes, and active matrix substrate 14 and counter substrate 15 thus fabricated are bonded together to manufacture display device 10.

Thus, a method of manufacturing active matrix substrate 14 is described first with reference to FIGS. 11 to 18.

Figure 11:
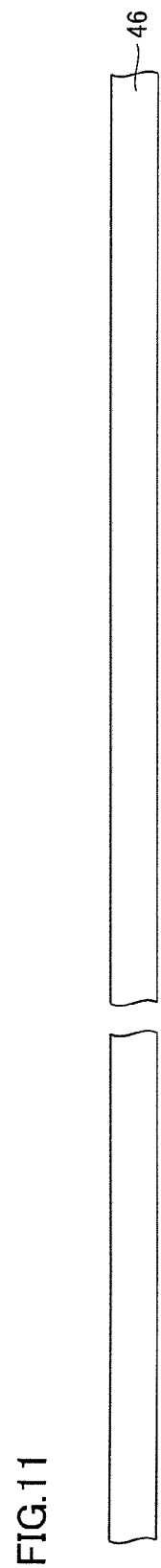
FIG. 11 is a cross-sectional view showing a first manufacturing step of active matrix substrate 14.
Figure 12:
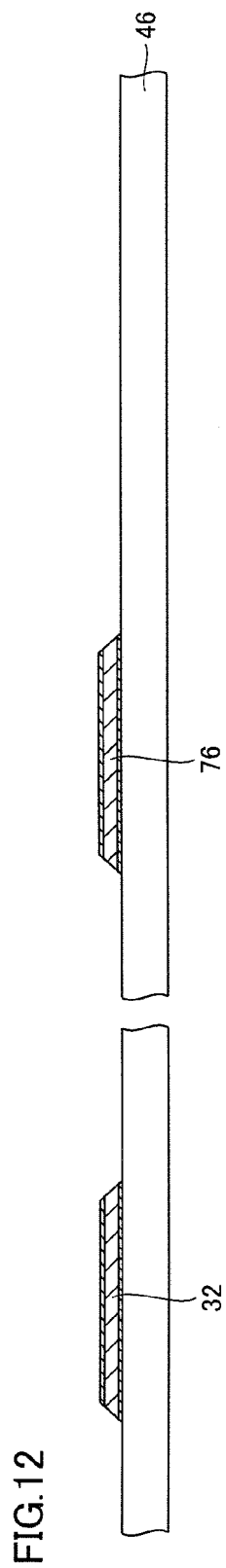
FIG. 12 is a cross-sectional view showing a step subsequent to the manufacturing step shown in FIG. 11.

FIG. 11 is a cross-sectional view showing a first manufacturing step of active matrix substrate 14. As shown in FIG. 11, glass substrate 46 having a main surface is prepared. Then, as shown in FIG. 12, a metallic film made of Ti or the like, a metallic film made of a metallic material such as Al, and a metallic film made of Ti or the like are successively formed by sputtering deposition on the main surface of glass substrate 46. The metallic films are stacked to a thickness of about 3000 Å. The stacked metallic films are then patterned with a mask, to form gate electrode 32 and gate electrode 76.

Figure 13:
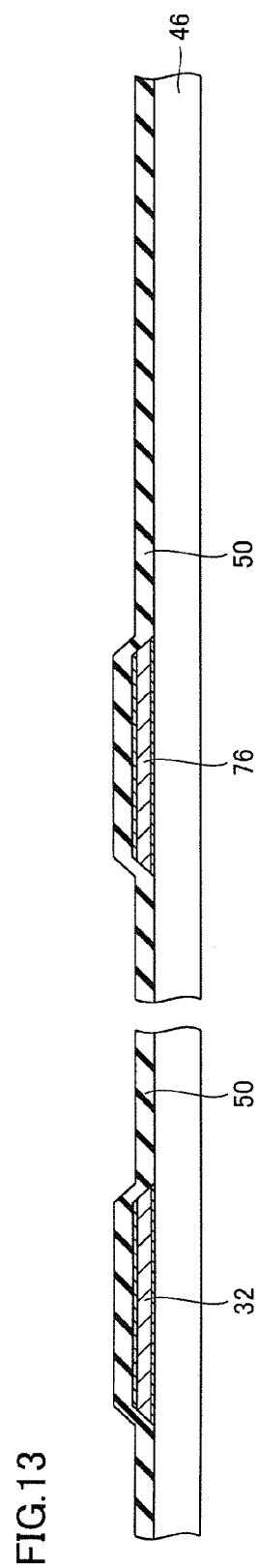
FIG. 13 is a cross-sectional view showing a step subsequent to the manufacturing step shown in FIG. 12.

Next, as shown in FIG. 13, tunnel insulating film 50 having a thickness of about 3500 Å is formed by CVD, for example. Tunnel insulating film 50 is formed on the main surface of glass substrate 46 to cover gate electrode 32 and gate electrode 76.

Figure 14:
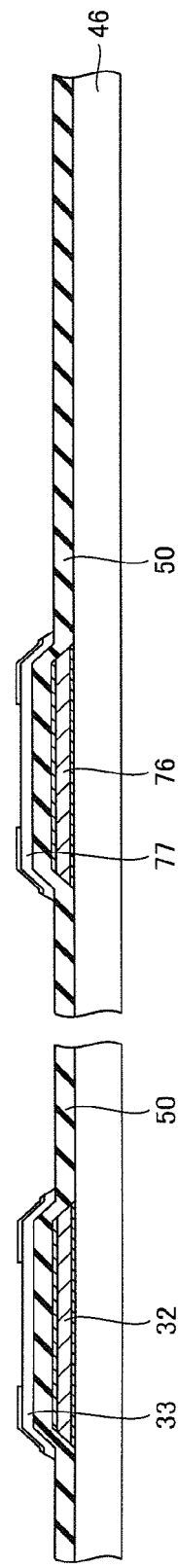
FIG. 14 is a cross-sectional view showing a step subsequent to the manufacturing step shown in FIG. 13.

Next, as shown in FIG. 14, a low-resistance semiconductor layer and a high-resistance semiconductor layer made of amorphous silicon or the like are successively stacked by CVD, for example. These low-resistance semiconductor layer and high-resistance semiconductor layer are then patterned, to form semiconductor layer 33 and semiconductor layer 77.

Figure 15:
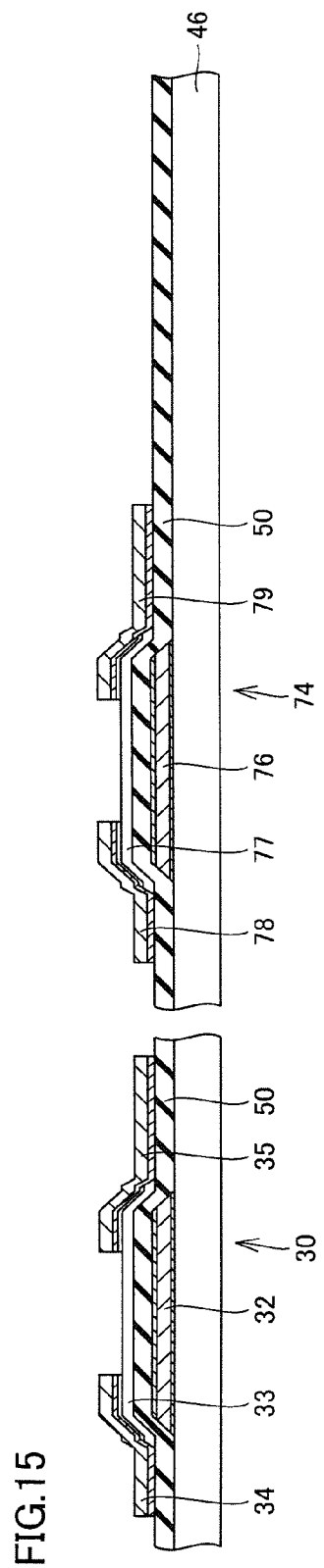
FIG. 15 is a cross-sectional view showing a step subsequent to the manufacturing step shown in FIG. 14.

Next, as shown in FIG. 15, a metallic film made of titanium or the like and a metallic film made of aluminum or the like are successively stacked by sputtering or the like to cover semiconductor layer 33 and semiconductor layer 77. The stacked metallic films are patterned to form source electrodes 34 and 78, and drain electrodes 35 and 79. TFT transistor 30 and selection transistor 74 are thus formed.

Figure 16:
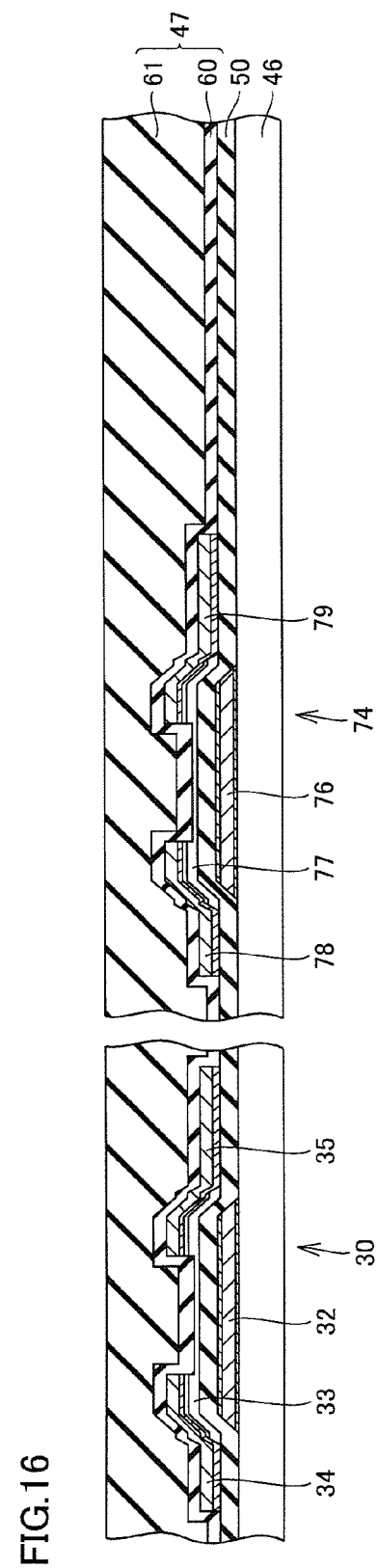
FIG. 16 is a cross-sectional view showing a step subsequent to the manufacturing step shown in FIG. 15.

Next, as shown in FIG. 16, protective film 60 and flattened film 61 are successively stacked to cover TFT transistor 30 and selection transistor 74, to form interlayer insulating film 47.

Figure 17:
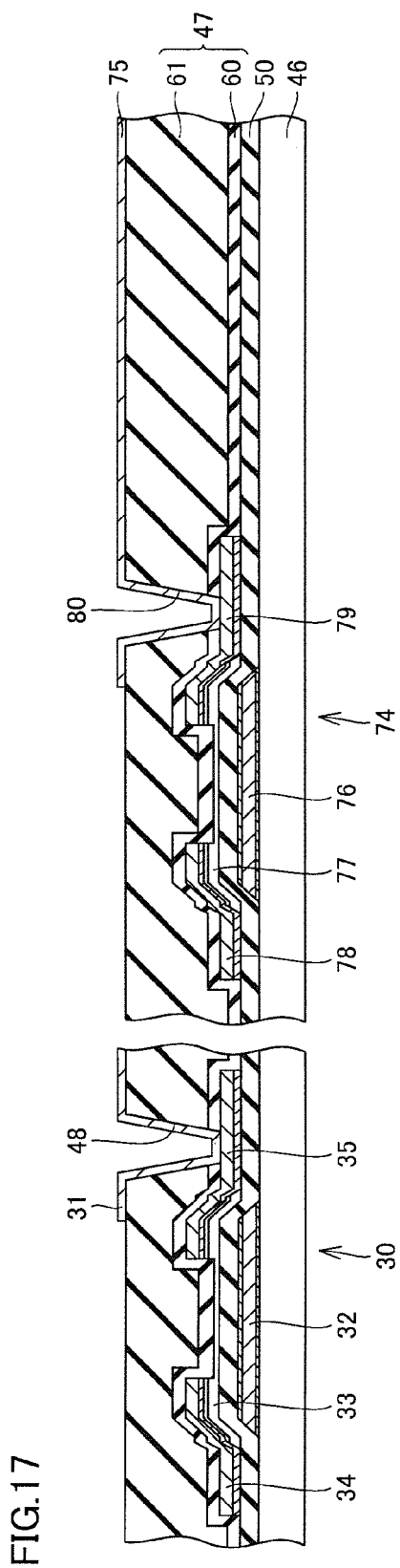
FIG. 17 is a cross-sectional view showing a step subsequent to the manufacturing step shown in FIG. 16.

Next, as shown in FIG. 17, interlayer insulating film 47 is patterned to form contact hole 48 and contact hole 80. Here, the upper surface of drain electrode 35 is exposed through the bottom of contact hole 48, and drain electrode 79 is exposed through the bottom of contact hole 80.

After contact holes 48 and 80 were formed, an ITO film is formed on the upper surface of interlayer insulating film 47. The ITO film is patterned to form pixel electrode 31 and lower electrode 75.

Figure 18:
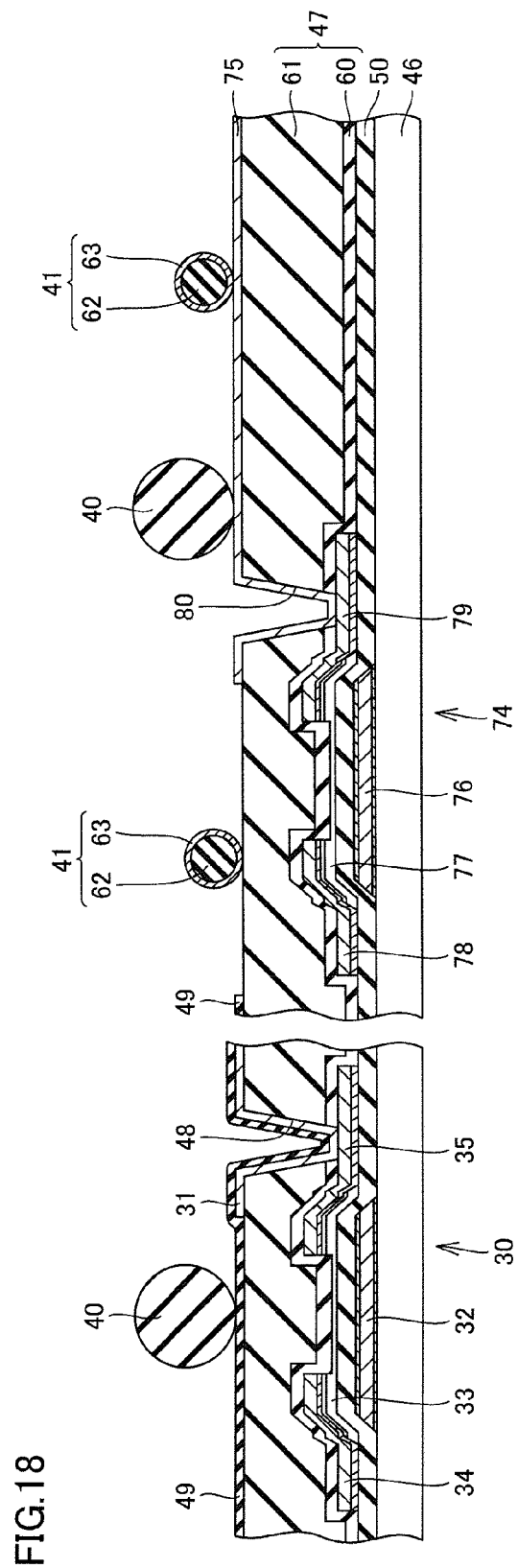
FIG. 18 is a cross-sectional view showing a step subsequent to the manufacturing step shown in FIG. 17.

Next, as shown in FIG. 18, a polyimide film is formed on the upper surface of interlayer insulating film 47 to cover alignment film 49 and lower electrode 75. The polyimide film is patterned so that it remains on pixel electrode 31. Here, the polyimide film that has been formed on lower electrode 75 is removed to expose lower electrode 75. The remaining polyimide film is subjected to a rubbing process, to form alignment film 49.

Then, conductive particles 41 are distributed on the upper surface of interlayer insulating film 47, and subsequently spacer balls 40 are distributed on the upper surface of interlayer insulating film 47. The order of distribution of spacer balls 40 and conductive particles 41 does not matter, and they may be simultaneously distributed. Active matrix substrate 14 is thus formed.

Conductive particles 41 to be distributed on the upper surface of interlayer insulating film 47 are passed through a sieve in advance to select only those having a prescribed outer diameter, to ensure that distributed conductive particles 41 have a uniform diameter. The step of selecting conductive particles 41 may include a selection step using a centrifugal separator. Spacer balls 40 to be distributed are likewise passed through a sieve in advance, to ensure that distributed spacer balls 40 have a uniform outer diameter.

Before spacer balls 40 and conductive particles 41 are distributed, annular sealing member 39 may be welded on the upper surface of interlayer insulating film 47 in advance.

Figure 19:
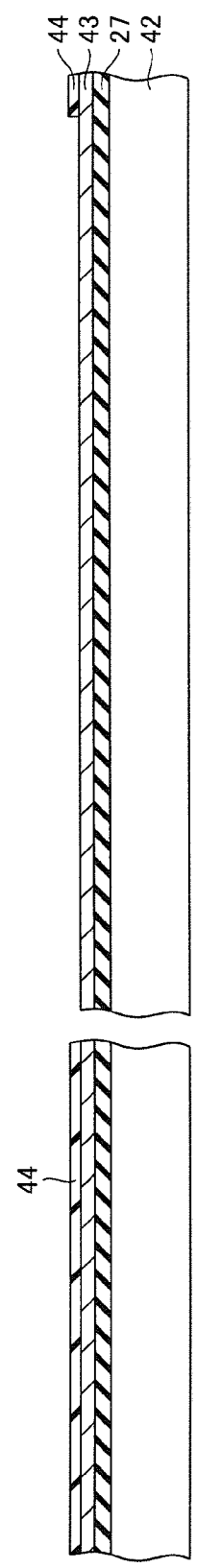
FIG. 19 is a cross-sectional view showing a step subsequent to the manufacturing step shown in FIG. 18.

Referring to FIG. 19, a method of manufacturing counter substrate 15 is described. First, glass substrate 42 is prepared. Color filter 27 is formed on the main surface of glass substrate 42. Then, a transparent conductive film such as an ITO film is formed on the upper surface of color filter 27, to form counter electrode 43. A polyimide film is formed on the upper surface of counter electrode 43, and is then patterned. As a result, the polyimide film remains in a portion which will be the display area, and is removed from a portion which will be the operation area. Then, the remaining polyimide film is subjected to a rubbing process, to form alignment film 44. Counter substrate 15 is thus formed.

Counter substrate 15 is arranged on the upper surface of active matrix substrate 14, and sealing member 39 is welded, to bond active matrix substrate 14 and counter substrate 15 together. When active matrix substrate 14 and counter substrate 15 are bonded together, as shown in FIG. 6, counter electrode 43 and lower electrode 75 are arranged opposite to each other.

In addition, as shown in FIG. 10, a clearance is provided between conductive particle 41 positioned on lower electrode 75 and counter electrode 43. Display unit 11 can be thus manufactured. Then, backlight 12 and the like are mounted on display unit 11, thereby manufacturing display device 10.

Second Embodiment

Referring to FIGS. 20 to 23, display device 10 according to a second embodiment is described. In FIGS. 20 to 23, elements the same as or corresponding to those in FIGS. 1 to 19 are designated by the same reference numerals, and descriptions thereof may not be repeated.

Figure 20:
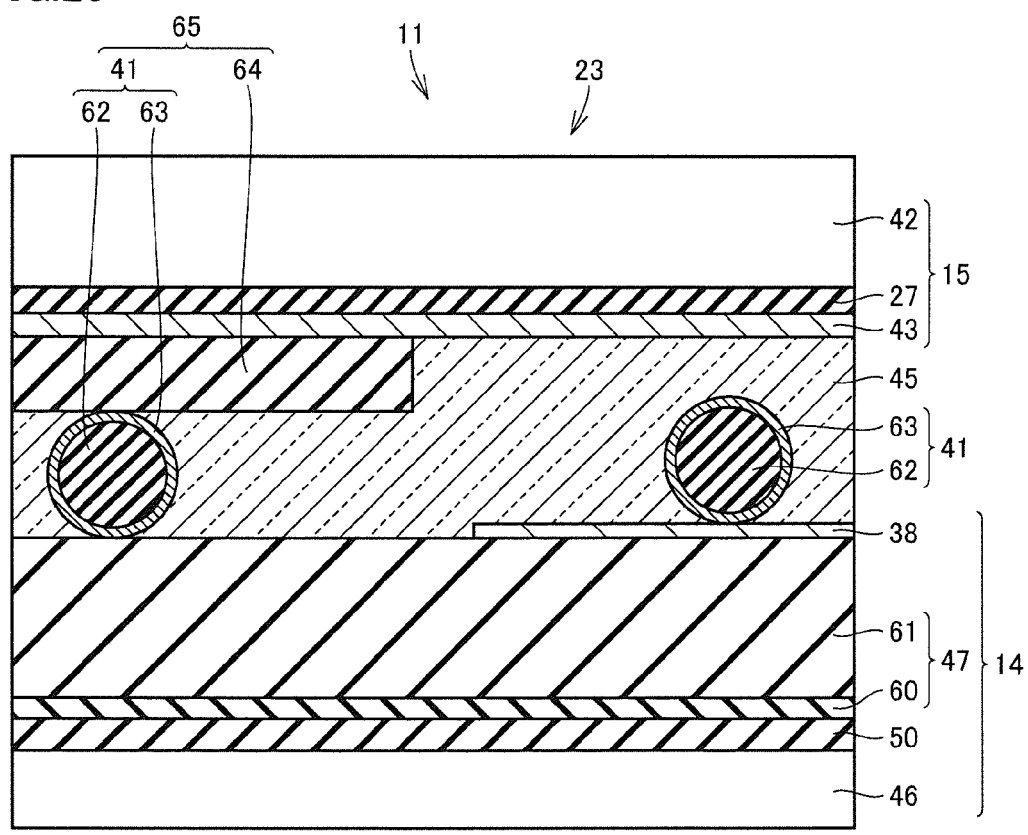
FIG. 20 is a cross-sectional view of display device 10 according to a second embodiment, showing operation area 23 and its surroundings.

FIG. 20 is a cross-sectional view of display device 10 according to the second embodiment, showing operation area 23 and its surroundings.

As shown in FIG. 20, counter substrate 15 includes an insulating film 64 formed on the lower surface of counter electrode 43. A portion of the lower surface of counter electrode 43 which is opposite to lower electrode 38 is exposed through insulating film 64.

Thus, when counter substrate 15 is pressed and sags, conductive particle 41 arranged on the upper surface of lower electrode 38 comes into contact with counter electrode 43, causing a current to flow between counter electrode 43 and lower electrode 38. Lower electrode 38 is connected to control unit 70 via sensor driver 26, and control unit 70 can sense that counter substrate 15 has sagged to a degree that counter electrode 43 comes into contact with conductive particle 41 above lower electrode 38.

Display device 10 according to the second embodiment includes insulating film 64 formed in a portion of the lower surface of counter electrode 43 which is distant from the portion of the lower surface opposite to lower electrode 38.

Conductive particle 41 is arranged between the upper surface of interlayer insulating film 47 and insulating film 64. This conductive particle 41 supports counter substrate 15 and active matrix substrate 14.

Namely, in display device 10 according to the second embodiment, insulating film 64, and conductive particle 41 positioned under insulating film 64 and arranged on the upper surface of active matrix substrate 14 form a support member 65 for maintaining the gap between counter substrate 15 and active matrix substrate 14.

Figure 21:
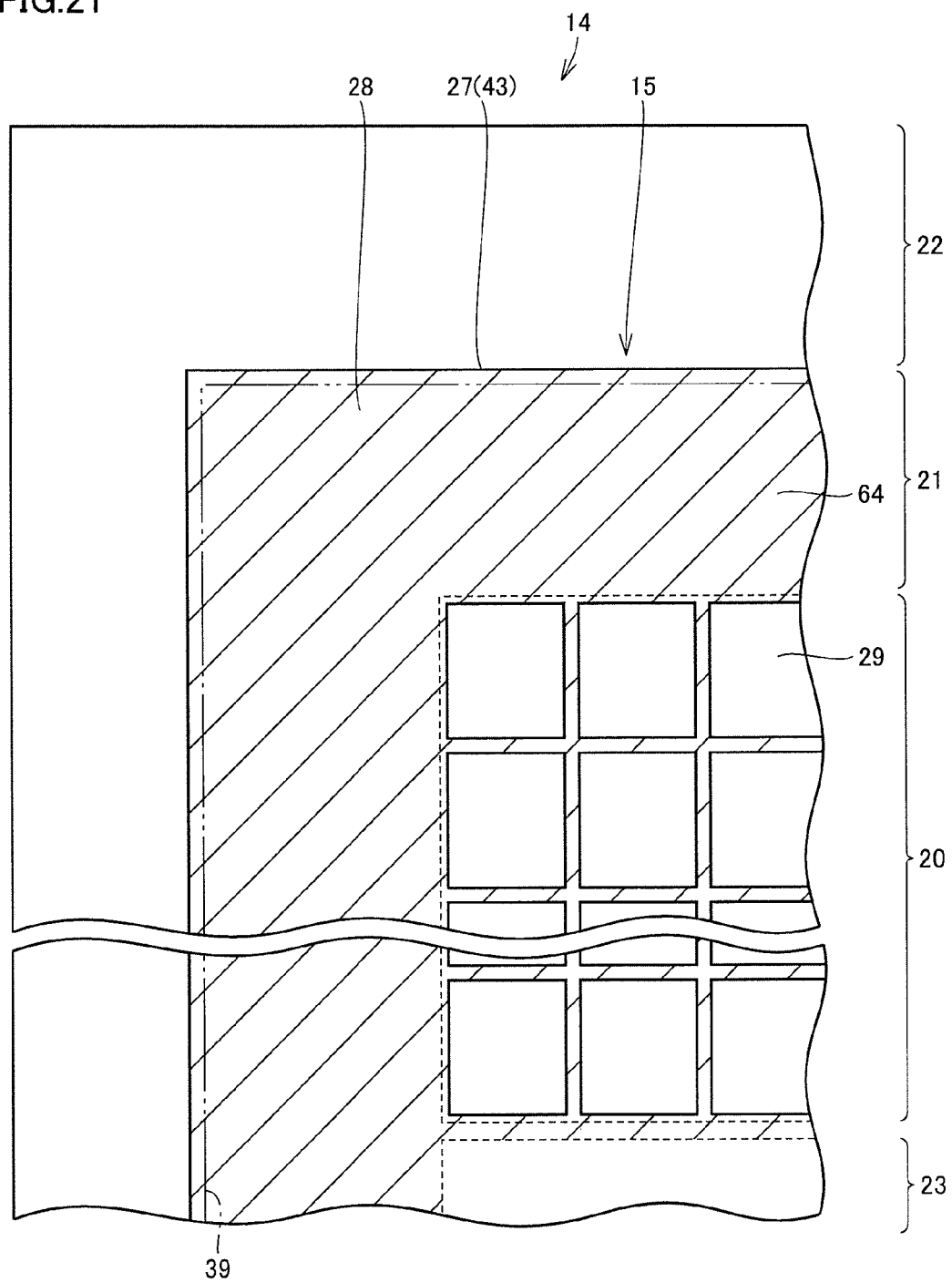
FIG. 21 is a plan view of active matrix substrate 14 and counter substrate 15.

FIG. 21 is a plan view of active matrix substrate 14 and counter substrate 15. A shaded area in FIG. 21 indicates a region where insulating film 64 is provided. As shown in FIG. 21, insulating film 64 is not formed in a portion of the lower surface of counter electrode 43 where operation area 23 is positioned. Insulating film 64 is not formed in a portion where color layers 29 are formed, either. Namely, insulating film 64 is positioned in a portion of the lower surface of counter electrode 43, which is positioned below black matrix 28, and in an area other than operation area 23.

Figure 22:
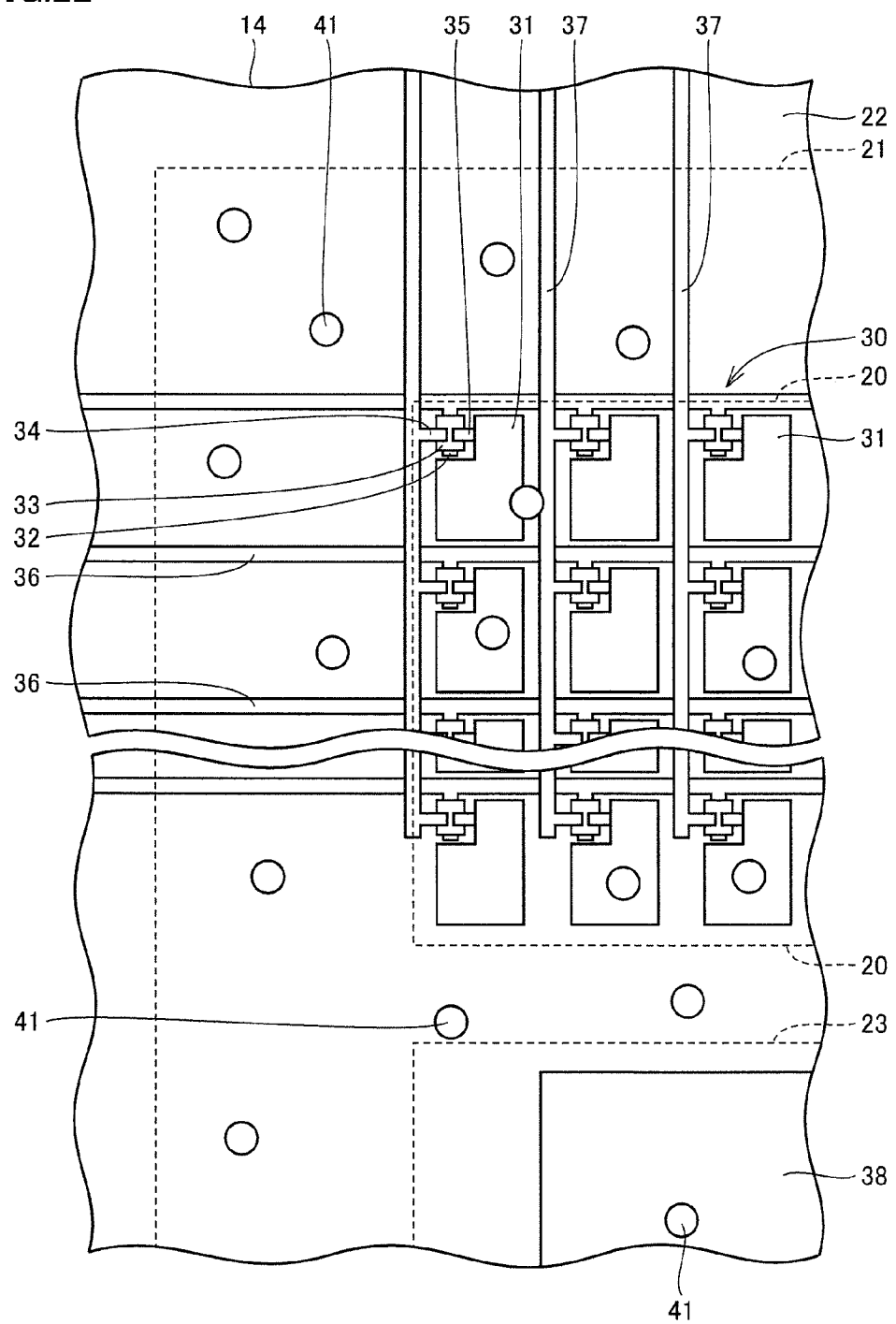
FIG. 22 is a plan view showing a part of active matrix substrate 14, after color filter 27 was removed from FIG. 21.

FIG. 22 is a plan view showing a part of active matrix substrate 14, after color filter 27 was removed from FIG. 21. As shown in FIG. 22, the plurality of conductive particles 41 are distributed on the upper surface of active matrix substrate 14, whereas spacer balls 40 are not distributed in display device 10 according to the second embodiment. The number of components is thus reduced.

Those of the plurality of conductive particles 41 that are distant from lower electrode 38 are positioned below insulating film 64 shown in FIG. 21, are in contact with insulating film 64, and support active matrix substrate 14 and counter substrate 15.

Although insulating film 64 is not formed in the portion of the lower surface of counter electrode 43 where operation area 23 is positioned in the example shown in FIG. 21, insulating film 64 may be formed in the portion where operation area 23 is positioned. For example, insulating film 64 may be arranged in a lattice form, to form a plurality of window portions through which a part of counter electrode 43 is exposed.

Figure 23:
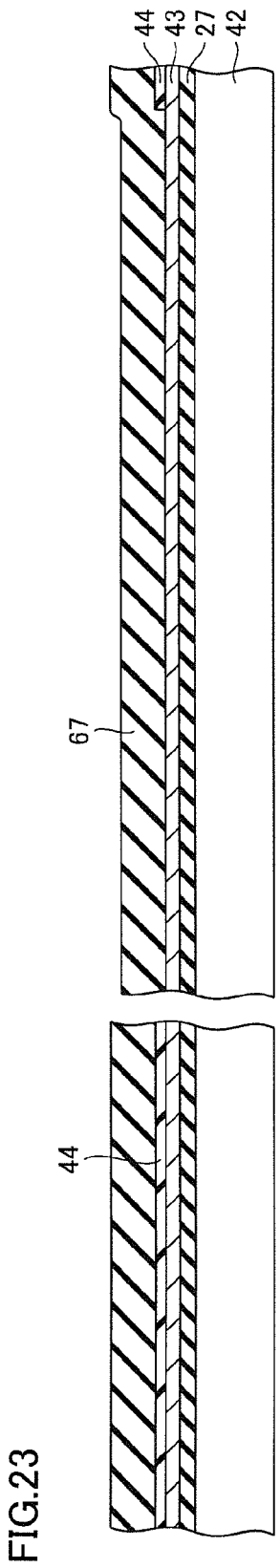
FIG. 23 is a cross-sectional view showing a manufacturing step subsequent to the manufacturing step shown in FIG. 19.
Figure 24:
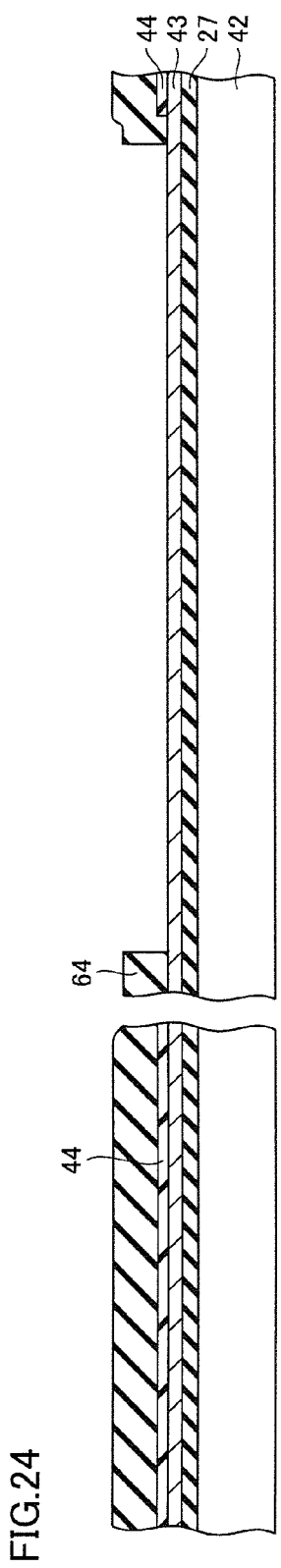
FIG. 24 is a cross-sectional view showing a manufacturing step subsequent to the manufacturing step shown in FIG. 23.

Referring to FIGS. 23 and 24, a method of manufacturing display device 10 according to the second embodiment is described. Again in display device 10 according to the second embodiment, active matrix substrate 14 and counter substrate 15 are fabricated in separate manufacturing processes. Active matrix substrate 14 according to the second embodiment can be fabricated through manufacturing steps similar to those of active matrix substrate 14 of display device 10 according to the first embodiment. Thus, a method of manufacturing counter substrate 15 is described.

FIG. 23 is a cross-sectional view showing a manufacturing step subsequent to the manufacturing step shown in FIG. 19. As shown in FIG. 23, color filter 27, counter electrode 43 and alignment film 44 are successively formed on the main surface of glass substrate 42, and then an insulating film 67 is formed on counter electrode 43 to cover alignment film 44. Next, as shown in FIG. 24, insulating film 64 is patterned to form an opening in a portion which will be operation area 23, to expose a part of counter electrode 43. Counter substrate 15 is thus fabricated.

Next, active matrix substrate 14 and counter substrate 15 are bonded together in a manner similar to the manufacturing method according to the first embodiment, thereby manufacturing display device 10 according to the second embodiment.

Third Embodiment

Figure 25:
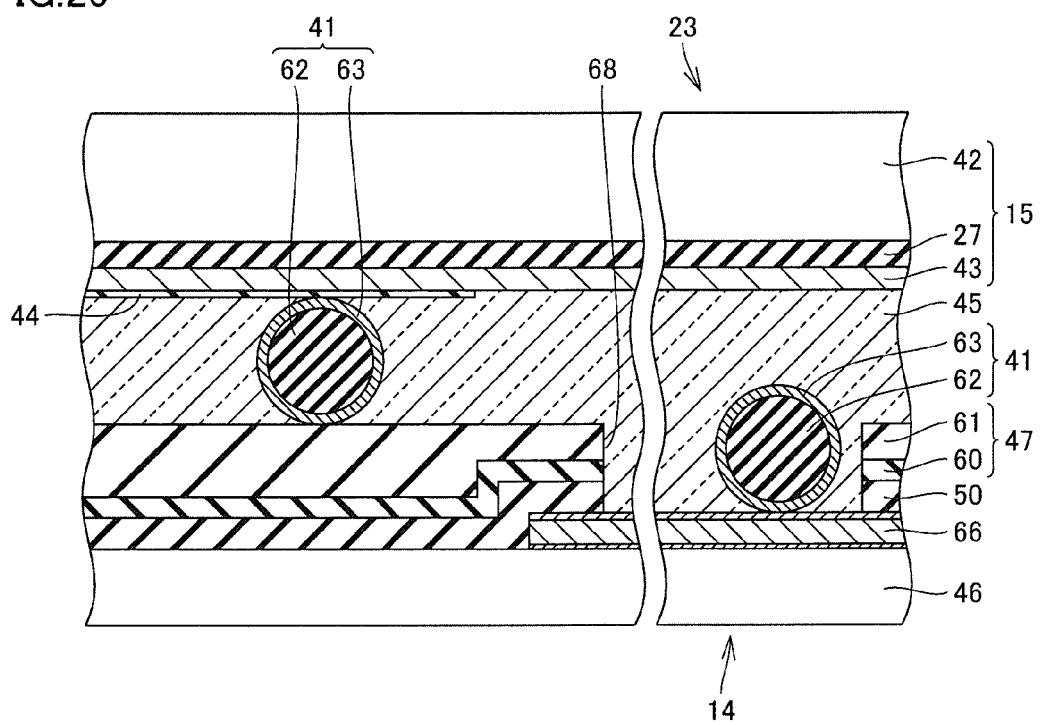
FIG. 25 is a cross-sectional view showing operation area 23 and its surrounding structure.

Referring to FIGS. 25 to 33, display device 10 according to a third embodiment is described. FIG. 25 is a cross-sectional view showing operation area 23 and its surrounding structure. As shown in FIG. 25, a lower electrode 66 is formed in a portion of the main surface of glass substrate 46 where operation area 23 is positioned. Lower electrode 66 is connected to sensor driver 26 shown in FIG. 2. Tunnel insulating film 50 and interlayer insulating film 47 are formed on the main surface of glass substrate 46, with an opening 68 formed in tunnel insulating film 50 and interlayer insulating film 47. At least a part of the upper surface of lower electrode 66 is exposed through opening 68.

Again in display device 10 according to the third embodiment, the plurality of conductive particles 41 are distributed on active matrix substrate 14.

Conductive particle 41 is arranged on the upper surface of lower electrode 66 exposed through opening 68, and conductive particle 41 is arranged on interlayer insulating film 47 as well. Alignment film 44 is not formed in a portion of the lower surface of counter electrode 43 which is opposite to opening 68. This portion is exposed. Conductive particle 41 arranged on lower electrode 66 has a lower end portion in contact with lower electrode 66, and an upper end portion which forms a clearance with counter electrode 43.

Conductive particle 41 positioned on the upper surface of interlayer insulating film 47 has an upper end portion which is in contact with counter substrate 15, and which maintains the gap between counter substrate 15 and active matrix substrate 14. Namely, conductive particle 41 positioned on interlayer insulating film 47 functions as a support member. Spacer balls 40 are not provided in display device 10 according to the third embodiment, either.

When counter substrate 15 is pressed by the user, conductive particle 41 positioned on interlayer insulating film 47 is elastically deformed, and counter substrate 15 sags. Then, conductive particle 41 positioned on lower electrode 66 comes into contact with counter electrode 43.

Referring to FIGS. 26 to 33, a method of manufacturing display device 10 having the structure as described above is described. Counter substrate 15 of display device 10 according to the third embodiment has a structure the same as that of counter substrate 15 of display device 10 according to the first embodiment, and can be fabricated through the same manufacturing steps. Thus, a method of manufacturing active matrix substrate 14 is described.

Figure 26:
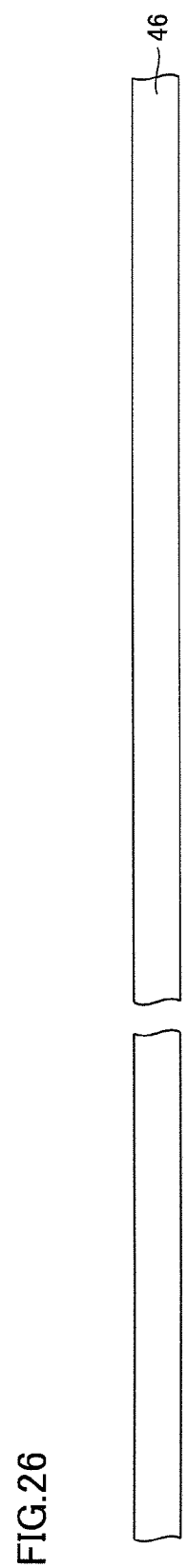
FIG. 26 is a cross-sectional view showing a manufacturing step of display device 10 according to a third embodiment.
Figure 27:
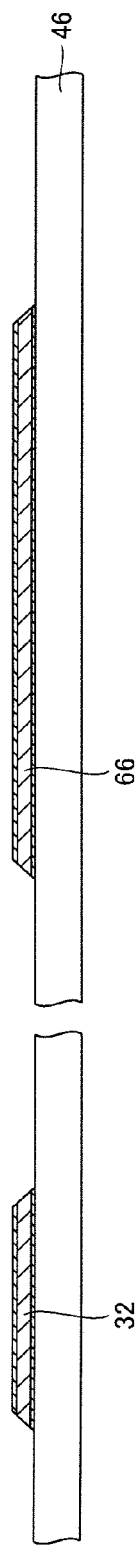
FIG. 27 is a cross-sectional view showing a manufacturing step subsequent to the manufacturing step shown in FIG. 26.

As shown in FIG. 26, glass substrate 46 having a main surface is prepared. Then, as shown in FIG. 27, a titanium film, an aluminum film and a titanium film are successively formed on the main surface of glass substrate 46. The stacked metallic films are then patterned, to form gate electrode 32 and lower electrode 66.

Figure 28:
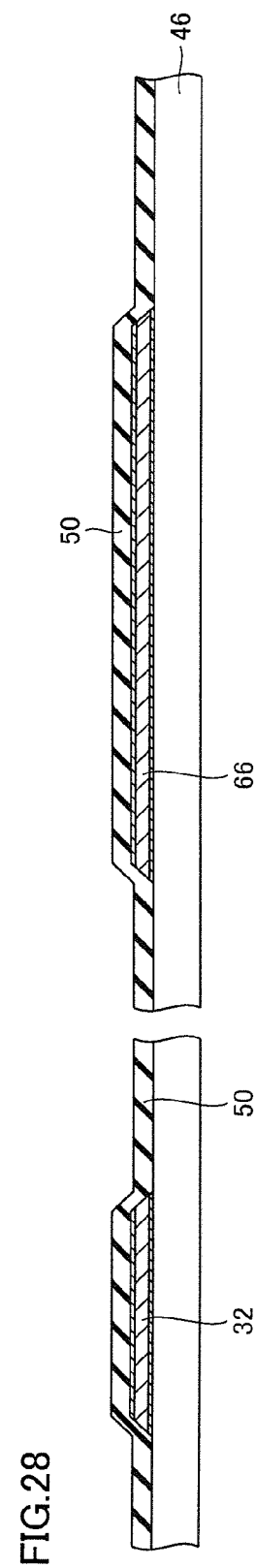
FIG. 28 is a cross-sectional view showing a manufacturing step subsequent to the manufacturing step shown in FIG. 27.
Figure 29:
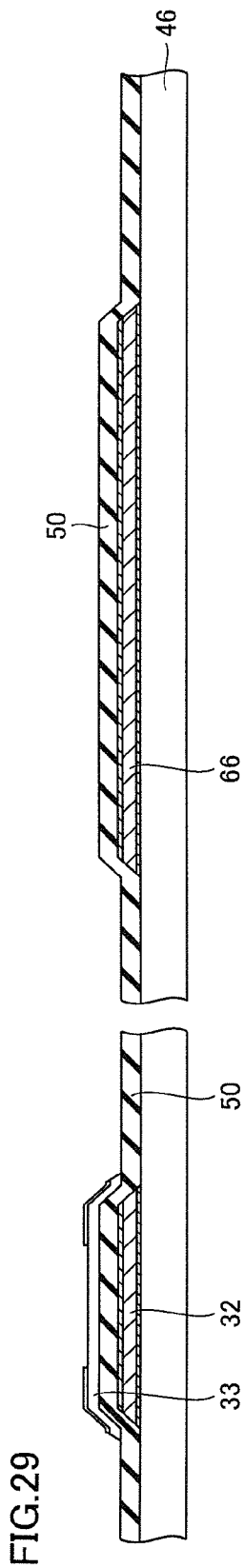
FIG. 29 is a cross-sectional view showing a manufacturing step subsequent to the manufacturing step shown in FIG. 28.

Next, as shown in FIG. 28, tunnel insulating film 50 is formed on the main surface of glass substrate 46 to cover gate electrode 32 and lower electrode 66. Next, as shown in FIG. 29, a high-resistance semiconductor layer and a low-resistance semiconductor layer are successively stacked on the upper surface of tunnel insulating film 50. The high-resistance semiconductor layer and the low-resistance semiconductor layer are then patterned, to form semiconductor layer 33 in a portion of the upper surface of tunnel insulating film 50 which is positioned above gate electrode 32. Portions of the high-resistance semiconductor layer and the low-resistance semiconductor layer which are positioned above lower electrode 66 are removed.

Figure 30:
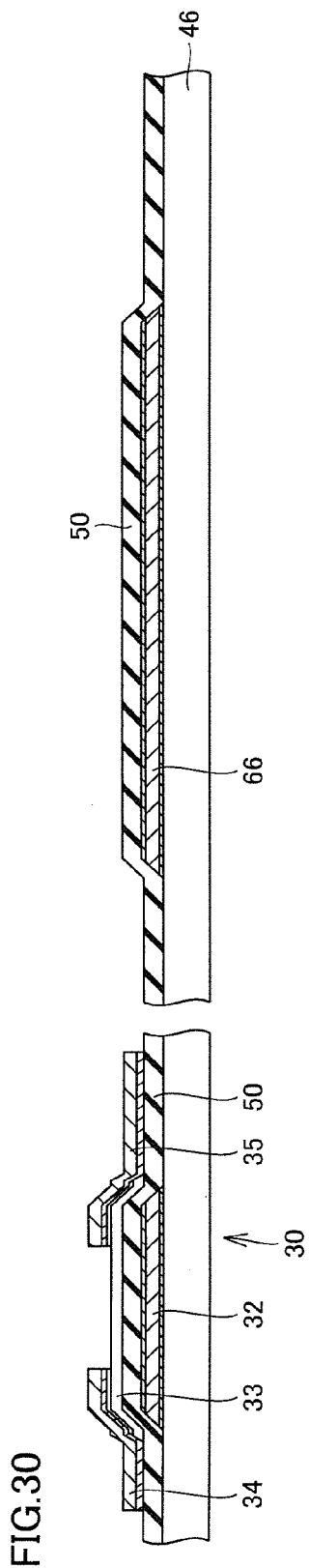
FIG. 30 is a cross-sectional view showing a manufacturing step subsequent to the manufacturing step shown in FIG. 29.

Next, as shown in FIG. 30, a titanium film and an aluminum film are successively stacked, and the stacked metallic films are patterned. This patterning forms source electrode 34 and drain electrode 35, and exposes a portion of the upper surface of tunnel insulating film 50 which is positioned above lower electrode 66.

Figure 31:
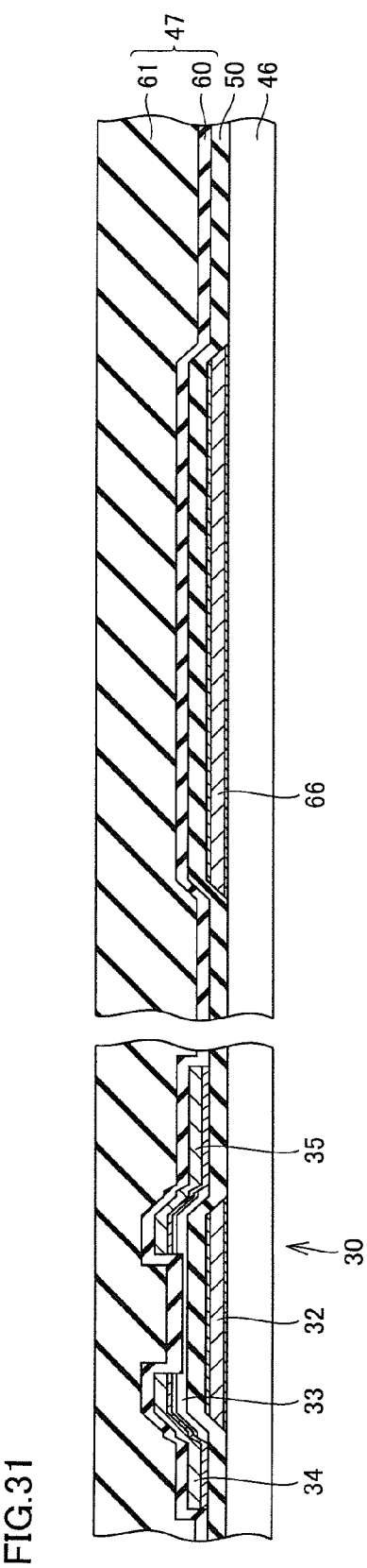
FIG. 31 is a cross-sectional view showing a manufacturing step subsequent to the manufacturing step shown in FIG. 30.

Next, as shown in FIG. 31, protective film 60 and flattened film 61 are successively stacked on the upper surface of tunnel insulating film 50 to cover TFT transistor 30. Flattened film 61 is then subjected to a flattening process such as CMP.

Figure 32:
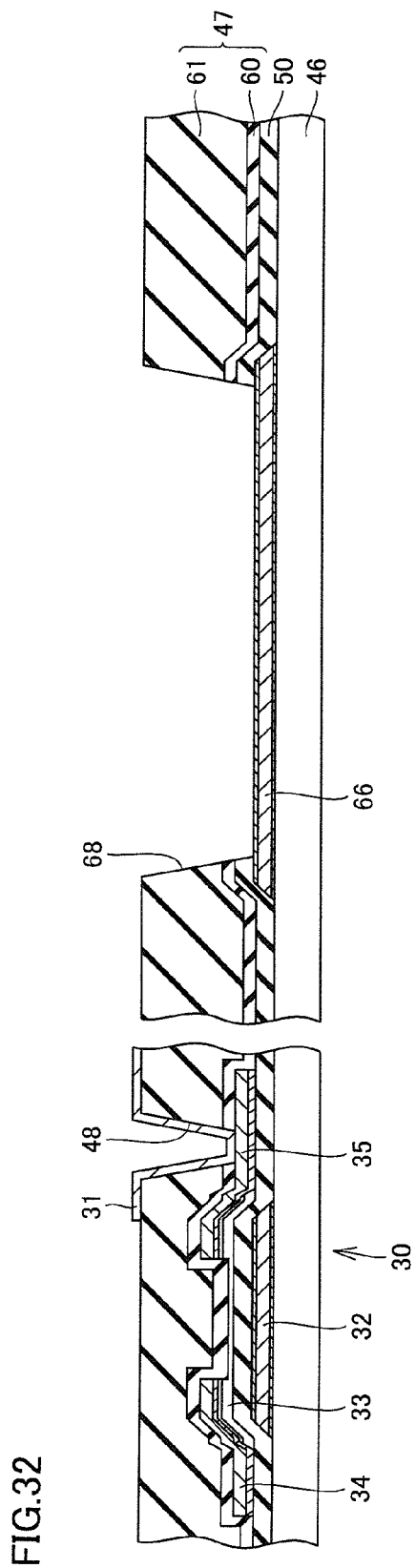
FIG. 32 is a cross-sectional view showing a manufacturing step subsequent to the manufacturing step shown in FIG. 31.

Next, as shown in FIG. 32, interlayer insulating film 47 is patterned to form contact hole 48 and opening 68. At least a part of lower electrode 66 is exposed through interlayer insulating film 47 and tunnel insulating film 50 by opening 68. A part of drain electrode 35 of TFT transistor 30 is exposed by contact hole 48.

Then, an ITO film is formed on interlayer insulating film 47 and patterned, to form pixel electrode 31. Here, the ITO film that has been formed on lower electrode 66 is removed. Although the ITO film that has been formed on lower electrode 66 is removed in the example shown in FIG. 32, the ITO film may remain on the upper surface of lower electrode 66.

Figure 33:
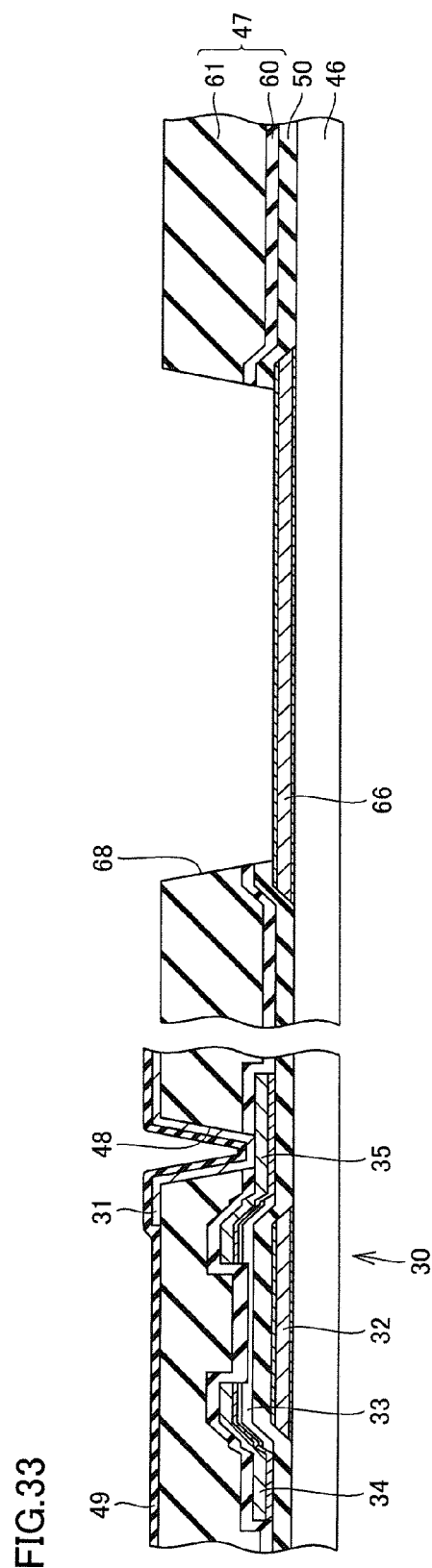
FIG. 33 is a cross-sectional view showing a manufacturing step subsequent to the manufacturing step shown in FIG. 32.

Next, as shown in FIG. 33, a polyimide film is formed and patterned. Here, the polyimide film that has been formed on the upper surface of lower electrode 66 is removed. Remaining polyimide film is then subjected to a rubbing process, to form alignment film 49.

Next, as shown in FIG. 25, conductive particles 41 are distributed on the upper surface of lower electrode 66 and the upper surface of interlayer insulating film 47.

Active matrix substrate 14 with distributed conductive particles 41 and counter substrate 15 are bonded together, and manufacturing steps the same as those of display device 10 according to the first embodiment are performed, thereby manufacturing display device 10 according to the third embodiment.

Fourth Embodiment

Referring to FIGS. 34 to 38, display device 10 according to a fourth embodiment is described. In FIGS. 34 to 38, elements the same as or corresponding to those in FIGS. 1 to 33 are designated by the same reference numerals, and descriptions thereof may not be repeated.

Figure 34:
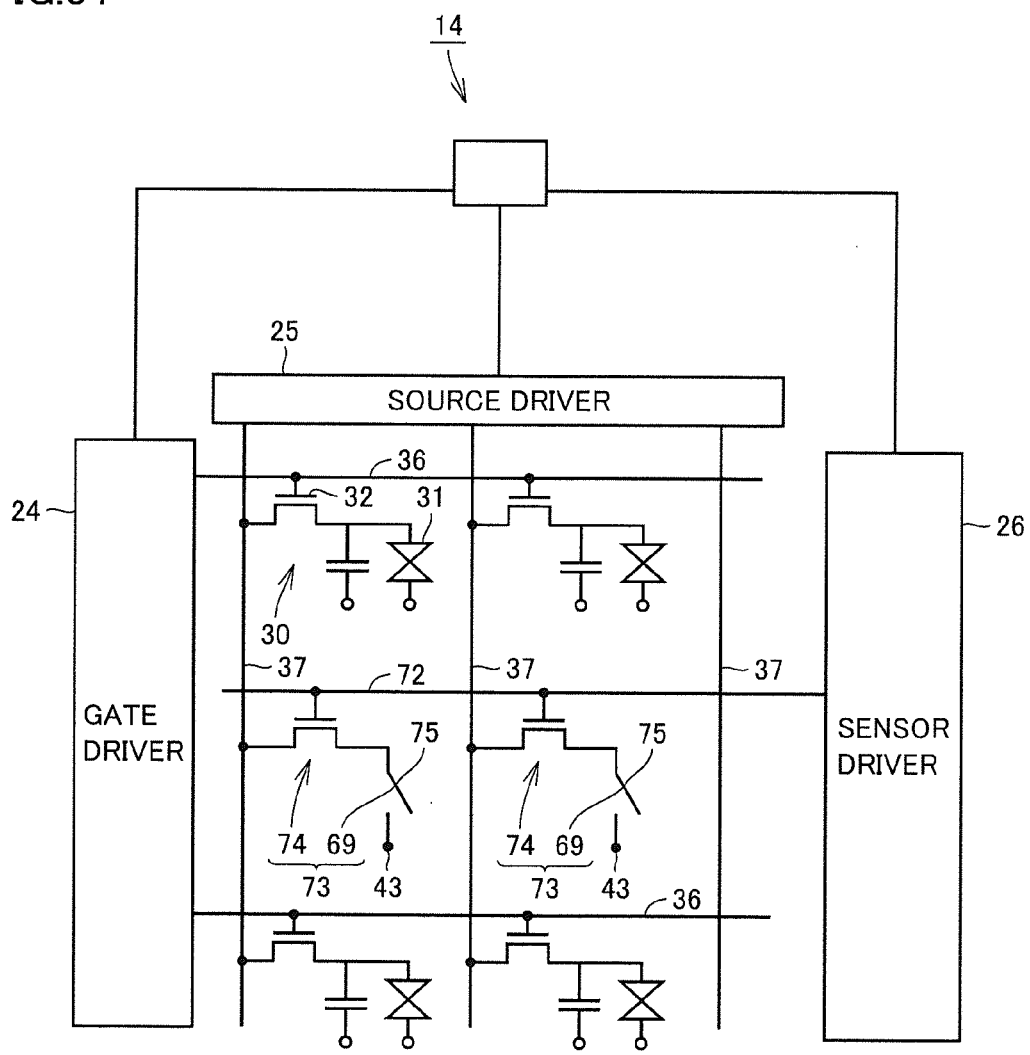
FIG. 34 schematically shows an electrical circuit of active matrix substrate 14 of display device 10 according to a fourth embodiment.

FIG. 34 schematically shows an electrical circuit of active matrix substrate 14 of display device 10 according to the fourth embodiment. As shown in FIG. 34, active matrix substrate 14 is provided with the plurality of gate lines 36 at a distance from one another, and the plurality of source lines 37 at a distance from one another which are orthogonal to gate lines 36.

Two adjacent gate lines 36 and two adjacent source lines 37 form one pixel.

Sensor line 72 is provided between gate lines 36. Sensor line 72 is formed parallel to gate lines 36, and has an end portion connected to sensor driver 26. Sensor line 72 is connected to sensor elements 73.

Each of sensor elements 73 includes selection transistor 74 connected to sensor line 72 and source line 37, and a switch 69 connected to selection transistor 74. Switch 69 includes lower electrode 75, counter electrode 43, and conductive particle 41 to be described later.

Figure 35:
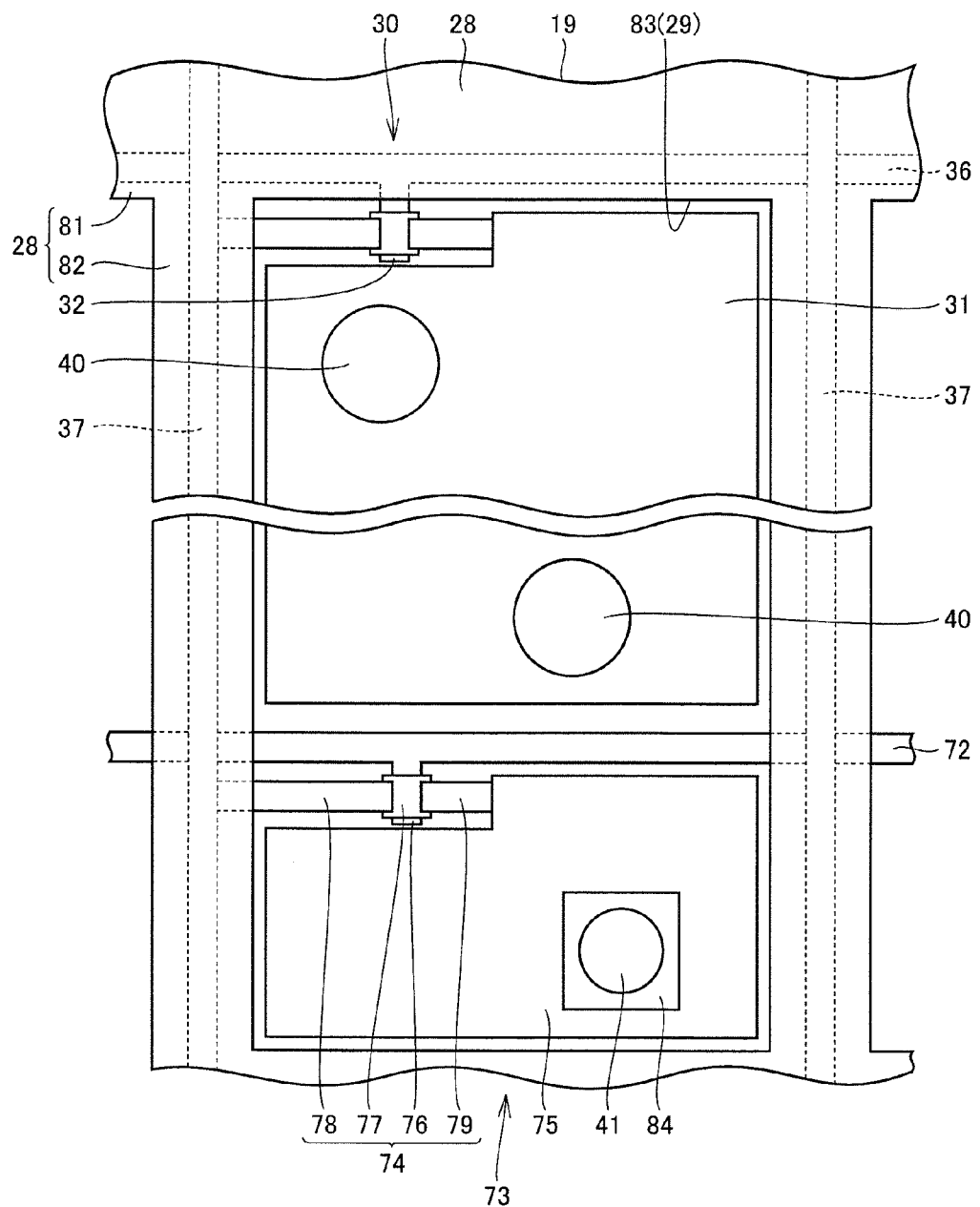
FIG. 35 is a plan view schematically showing one pixel.

FIG. 35 is a plan view schematically showing one pixel. As shown in FIG. 35, black matrix 28 includes beam portions 81 positioned above and extending along gate lines 36, and beam portions 82 positioned above and extending along source lines 37. Two adjacent beam portions 81 and two adjacent beam portions 82 form a window portion 83, in which color layer 29 is formed.

When active matrix substrate 14 and a color filter 19 are seen from above color filter 19, selection transistor 74 and lower electrode 75 are positioned in window portion 83. A resist 84 and conductive particle 41 arranged in resist 84 are provided on the upper surface of lower electrode 75.

Figure 36:
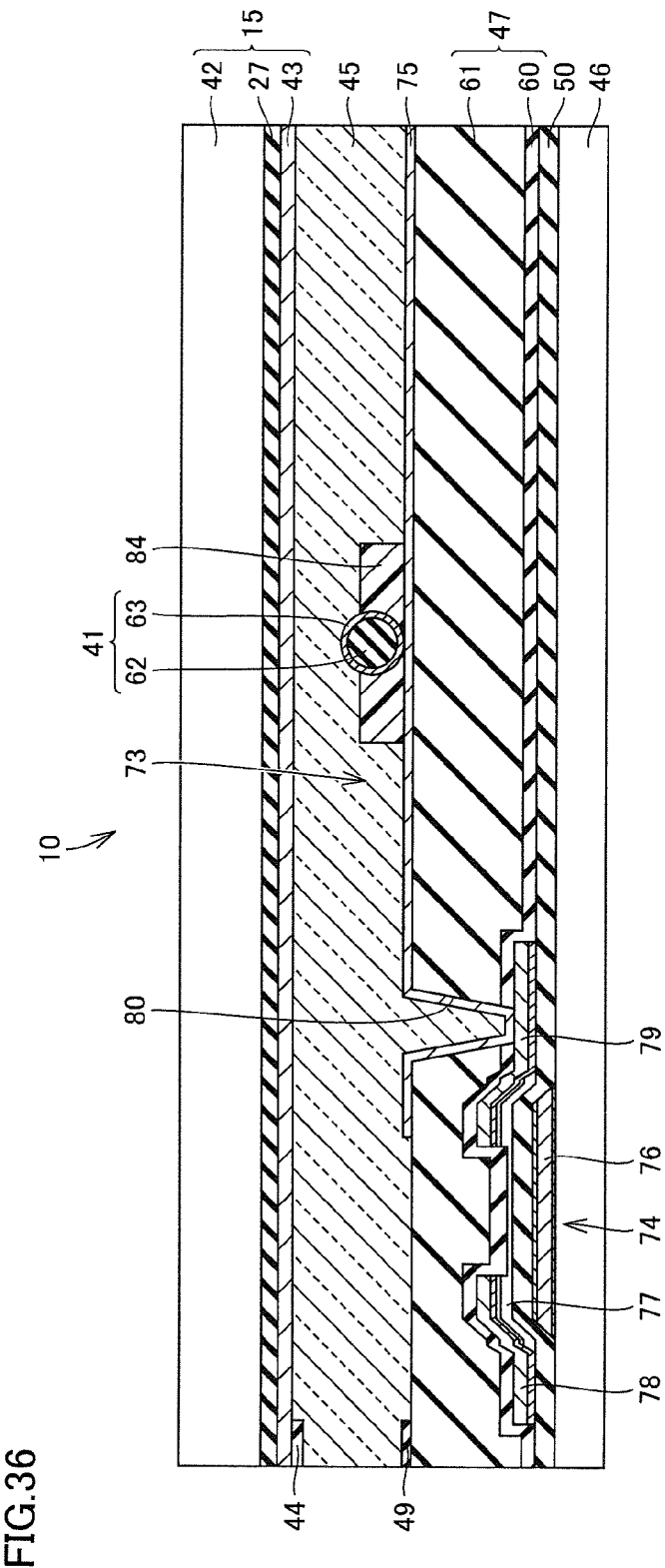
FIG. 36 is a cross-sectional view of sensor element 73.

FIG. 36 is a cross-sectional view of sensor element 73. As shown in FIG. 36, conductive particle 41 arranged on the upper surface of lower electrode 75 is fixed by resist 84. Conductive particle 41 has an upper surface exposed thorough resist 84, and a lower end portion in contact with lower electrode 75. A portion of counter electrode 43 which is opposite to lower electrode 75 is exposed through alignment film 44.

When selection transistor 74 is turned on and counter substrate 15 is pressed by the user, causing conductive particle 41 to come into contact with counter electrode 43, a current flows between conductive particle 41 and counter electrode 43 through conductive particle 41. Control unit 70 can sense that a portion of counter substrate 15 which is in the vicinity of selection transistor 74 has been pressed. The position of conductive particle 41 is fixed by resist 84, and at least one conductive particle 41 is fixed on each lower electrode 75. Accordingly, the movement of conductive particle 41 positioned on lower electrode 75 can be suppressed.

According to display device 10 of the fourth embodiment, the plurality of sensor elements 73 are provided in operation area 23, and control unit 70 can sense whether or not the screen has been touched by the user's finger or the like, based on outputs from sensor elements 73. Control unit 70 performs various functions such as switching of the screen, based on the outputs from sensor elements 73.

Figure 37:
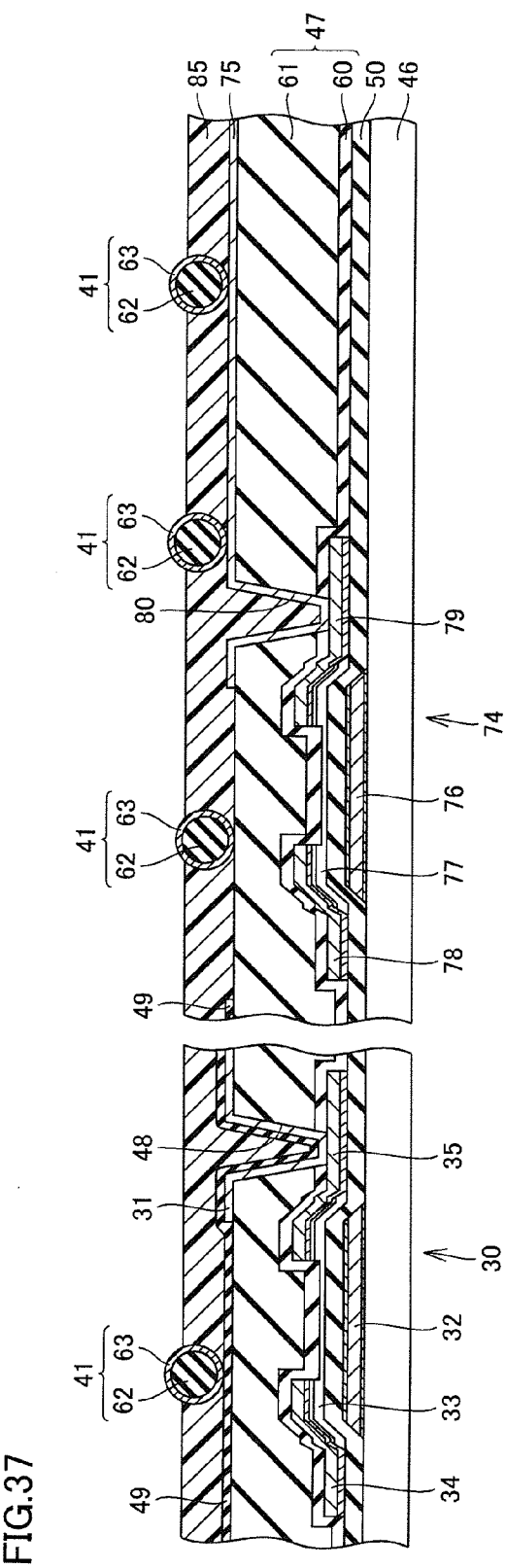
FIG. 37 is a cross-sectional view showing a step subsequent to the manufacturing step shown in FIG. 18.
Figure 38:
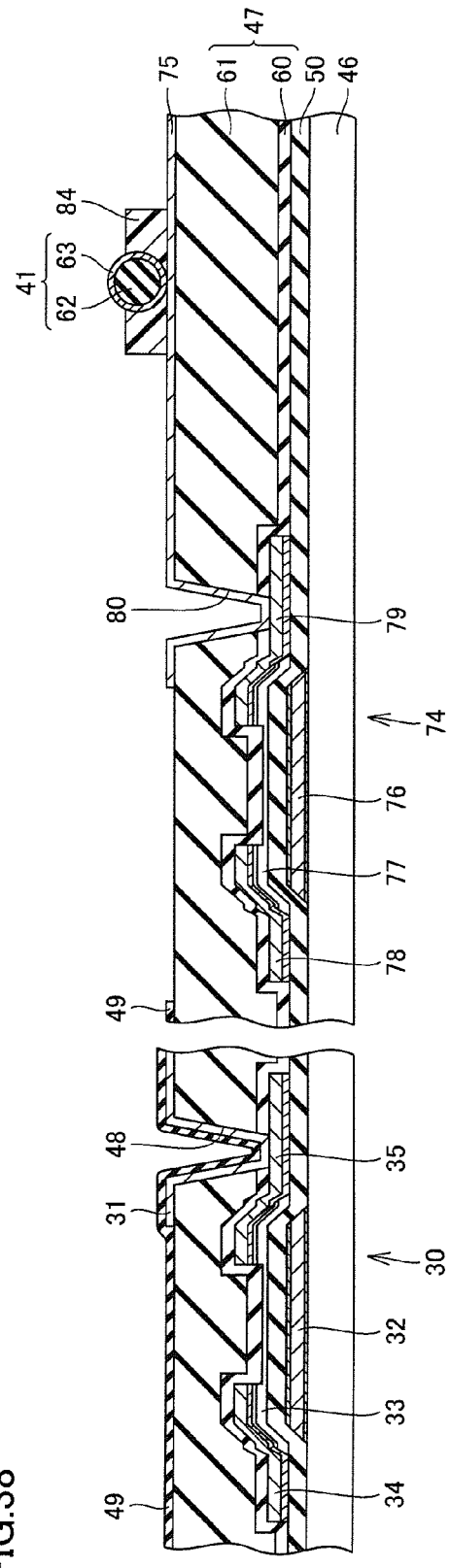
FIG. 38 is a cross-sectional view showing a manufacturing step subsequent to the manufacturing step shown in FIG. 37.

Referring to FIGS. 37 and 38, a method of manufacturing display device 10 according to the fourth embodiment is described. FIG. 37 is a cross-sectional view showing a step subsequent to the manufacturing step shown in FIG. 18.

As shown in FIG. 37, a resist solvent 85 having conductive particles 41 mixed therein is applied to the upper surface of interlayer insulating film 47 to cover the upper surfaces of lower electrode 75 and alignment film 49.

Next, as shown in FIG. 38, resist solvent 85 is patterned to leave conductive particle 41 on the upper surface of lower electrode 75, and form resist 84 for fixing remaining conductive particle 41 onto lower electrode 75. Resist 84 may be subjected to a firing process.

After conductive particles 41 are left in this manner, spacer balls 40 are distributed on interlayer insulating film 47. Then, steps similar to the manufacturing steps of display device 10 according to the first embodiment are performed, thereby manufacturing display device 10 according to the fourth embodiment.

Figure 39:
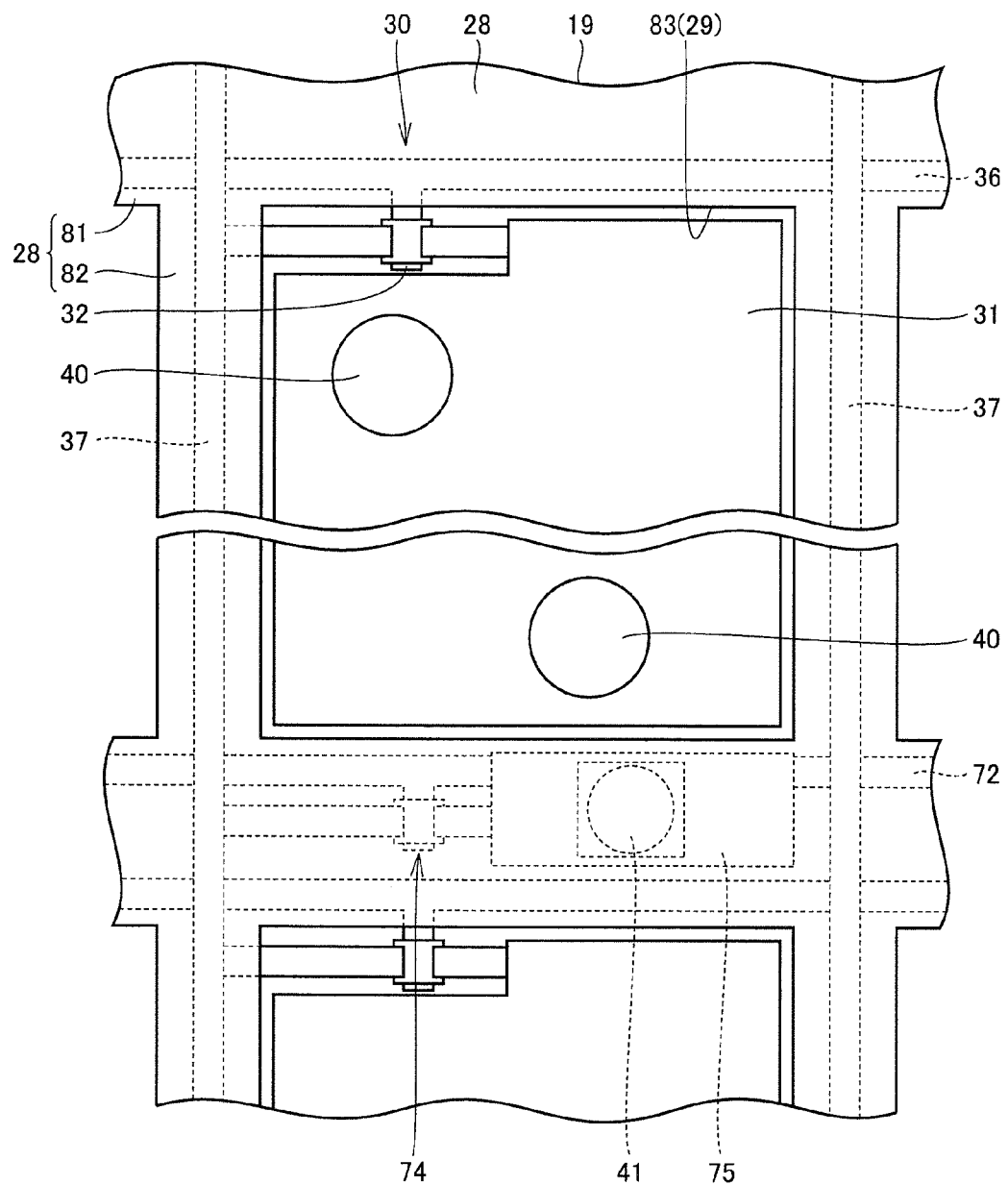
FIG. 39 is a plan view showing a modified example of display device 10.

Although selection transistor 74, lower electrode 75 and conductive particle 41 are positioned below color layer 29 in the described example, they may be arranged below beam portion 81 of black matrix 28, as shown in FIG. 39.

Fifth Embodiment

Referring to FIGS. 40 to 44, display device 10 according to a fifth embodiment is described. In FIGS. 40 to 44, elements the same as or corresponding to those in FIGS. 1 to 39 are designated by the same reference numerals, and descriptions thereof may not be repeated. An electrical circuit of display device 10 according to the fifth embodiment is the same as that of display device 10 according to the fourth embodiment, which is shown in FIG. 34.

Figure 40:
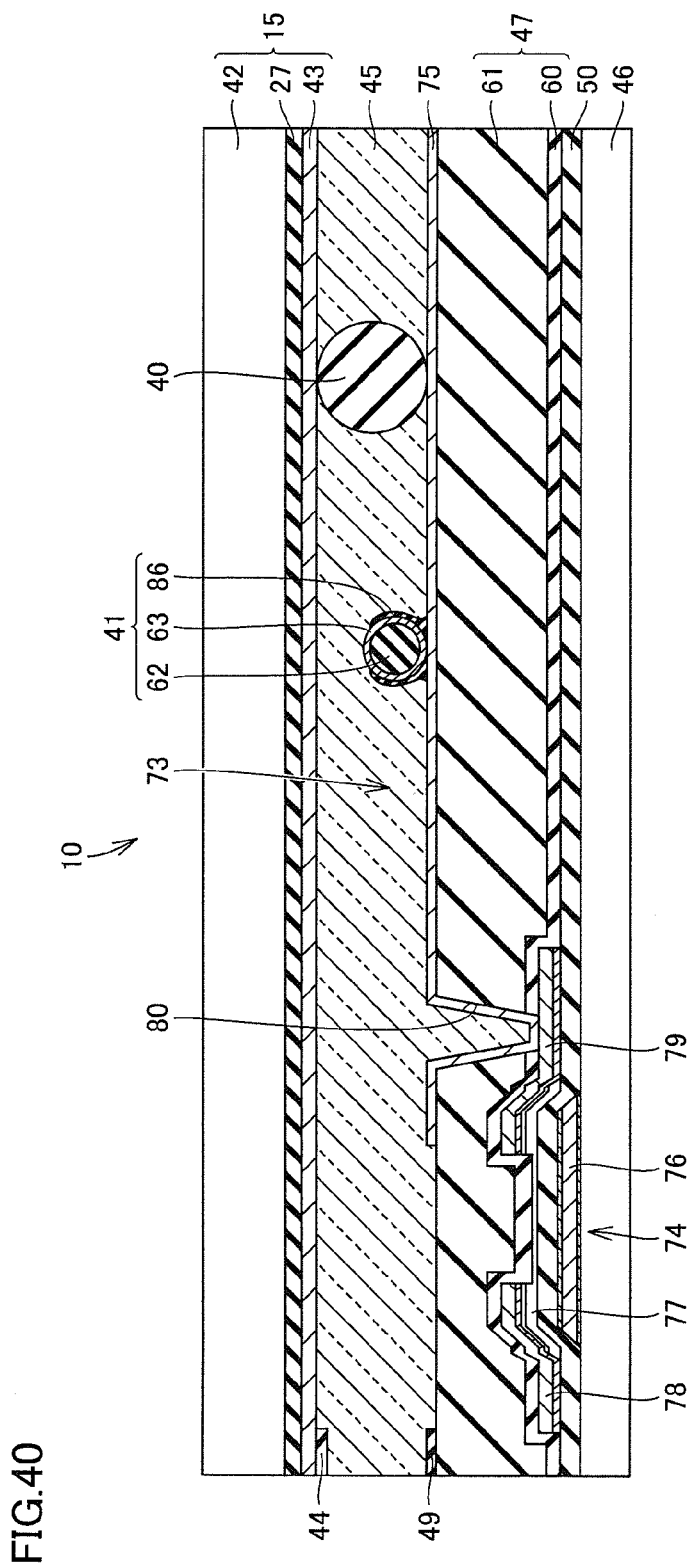
FIG. 40 is a cross-sectional view of display device 10 according to a fifth embodiment.

FIG. 40 is a cross-sectional view of display device 10 according to the fifth embodiment. As shown in FIG. 40, conductive particle 41 positioned on the upper surface of lower electrode 75 is fixed on the upper surface of lower electrode 75 by a bonding layer 86.

Figure 41:
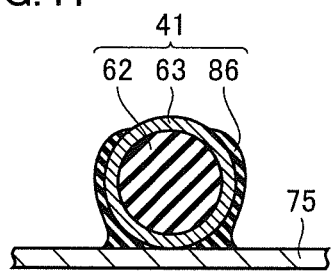
FIG. 41 is a cross-sectional view of a conductive particle 41.

FIG. 41 is a cross-sectional view of conductive particle 41. As shown in FIG. 41, in display device 10 according to the fifth embodiment, conductive particle 41 includes core portion 62 made of an elastically deformable resin, conductive film 63 formed on the surface of core portion 62, and bonding layer 86 formed on the surface of conductive film 63.

Bonding layer 86 is bonded to lower electrode 75, and conductive particle 41 is fixed on the upper surface of lower electrode 75. Conductive film 63 has an upper end portion exposed through bonding layer 86, and core portion 62 has a lower end portion bonded to lower electrode 75.

Again in display device 10 according to the fifth embodiment, when the user presses counter substrate 15, spacer balls 40 are elastically deformed, causing the upper end portions of conductive particles 41 to come into contact with counter electrode 43. The fact that the user has pressed counter substrate 15 can be sensed.

Figure 42:
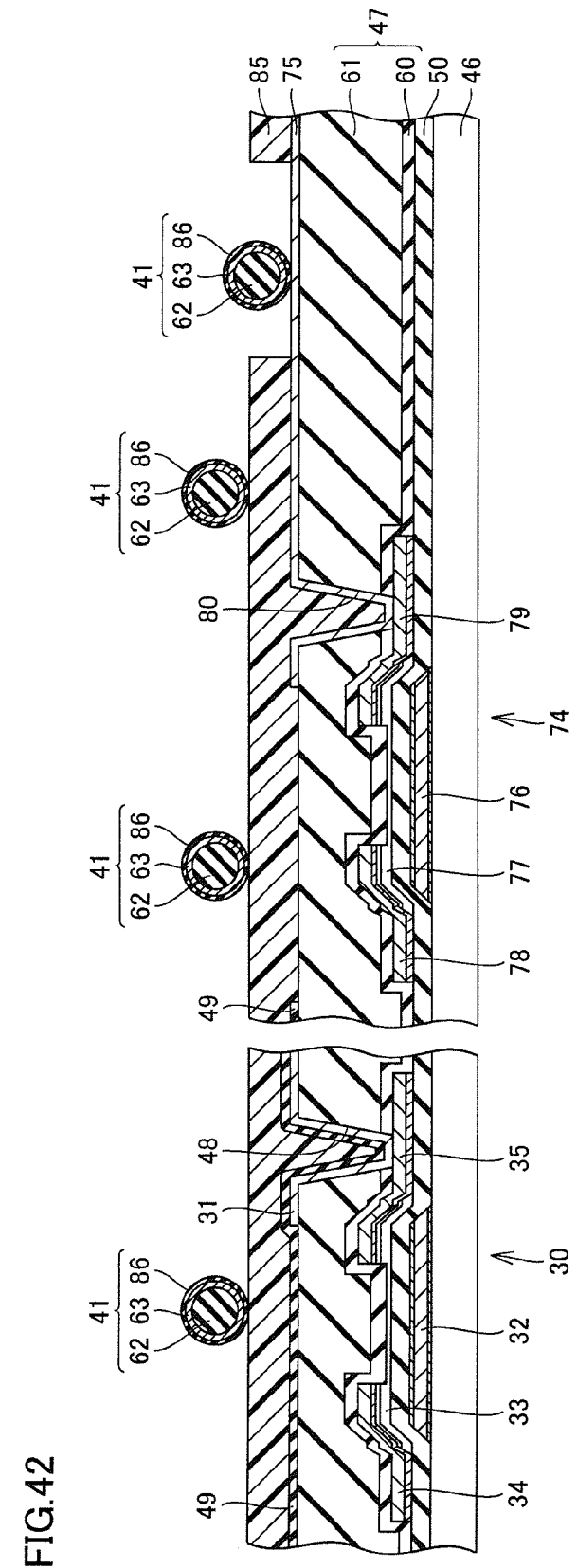
FIG. 42 is a cross-sectional view showing a manufacturing step of display device 10 according to the fifth embodiment.
Figure 43:
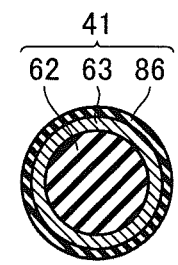
FIG. 43 is a cross-sectional view of distributed conductive particle 41.
Figure 44:
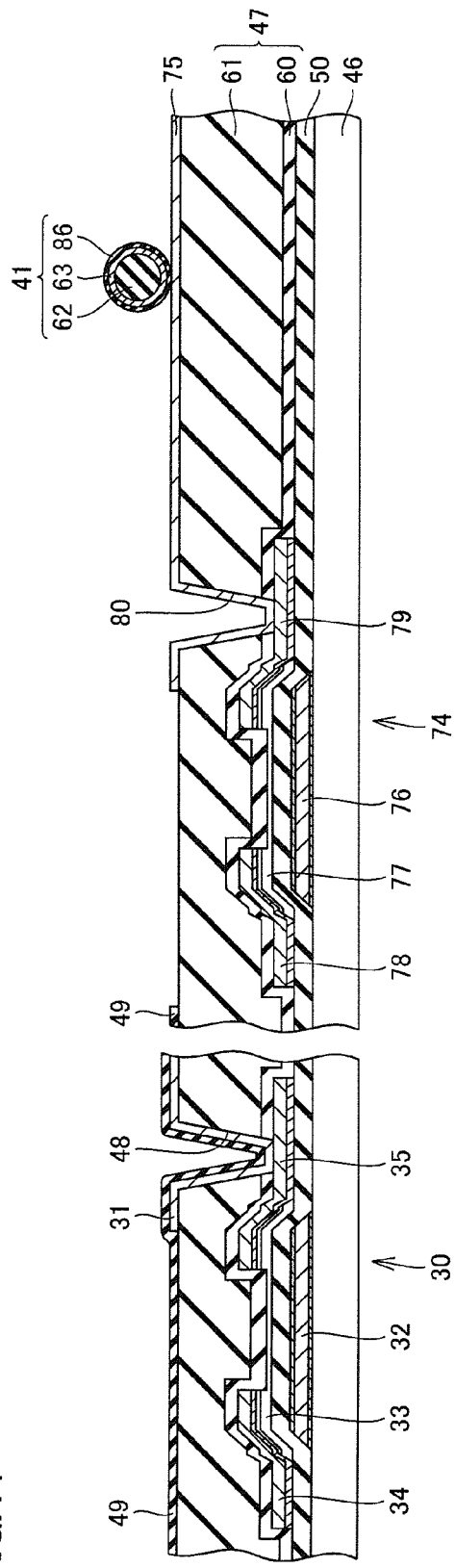
FIG. 44 is a cross-sectional view showing a manufacturing step subsequent to the manufacturing step shown in FIG. 42.

Referring to FIGS. 42 to 44, a method of manufacturing display device 10 according to the fifth embodiment is described. FIG. 42 is a cross-sectional view showing a manufacturing step of display device 10 according to the fifth embodiment. FIG. 42 is a cross-sectional view showing a manufacturing step subsequent to the manufacturing step shown in FIG. 17. As shown in FIG. 42, resist solvent 85 is applied to the upper surface of interlayer insulating film 47 to cover alignment film 49 and lower electrode 75.

Resist solvent 85 is patterned to expose a part of the upper surface of lower electrode 75 through resist solvent 85. After the upper surface of lower electrode 75 is exposed, conductive particles 41 are distributed. Distributed conductive particles 41 are arranged on the exposed upper surface of lower electrode 75 and the upper surface of resist solvent 85. FIG. 43 is a cross-sectional view of distributed conductive particle 41. As shown in FIG. 43, thin bonding layer 86 is formed on the surface of conductive particle 41.

After being distributed as shown in FIG. 42, conductive particles 41 are heated. The heating of conductive particles 41 melts bonding layer 86, causing bonding layer 86 shown in FIG. 43 to be bonded to lower electrode 75. Here, as shown in FIG. 41, the upper end portion of conductive film 63 is exposed through bonding layer 86, and the lower end portion of conductive film 63 comes into contact with lower electrode 75.

In this manner, again in display device 10 according to the fifth embodiment, at least one conductive particle 41 can be fixed on the upper surface of each lower electrode 75.

Next, as shown in FIG. 44, resist solvent 85 and conductive particles 41 on resist solvent 85 are removed. On the other hand, conductive particle 41 positioned on lower electrode 75 is fixed on lower electrode 75, and thus remains on the upper surface of lower electrode 75.

Then, spacer balls 40 are distributed on the upper surface of interlayer insulating film 47, a sealing member is arranged on the upper surface of active matrix substrate 14, and counter substrate 15 that has been fabricated in separated steps and active matrix substrate 14 are bonded together, to assemble display unit 11.

Then, steps similar to the manufacturing steps according to the first embodiment are performed, thereby assembling display device 10 according to the fifth embodiment.

Sixth Embodiment

Referring to FIGS. 45 to 48, display device 10 according to a sixth embodiment is described. In FIGS. 45 to 48, elements the same as or corresponding to those in FIGS. 1 to 44 are designated by the same reference numerals, and descriptions thereof may not be repeated.

Figure 45:
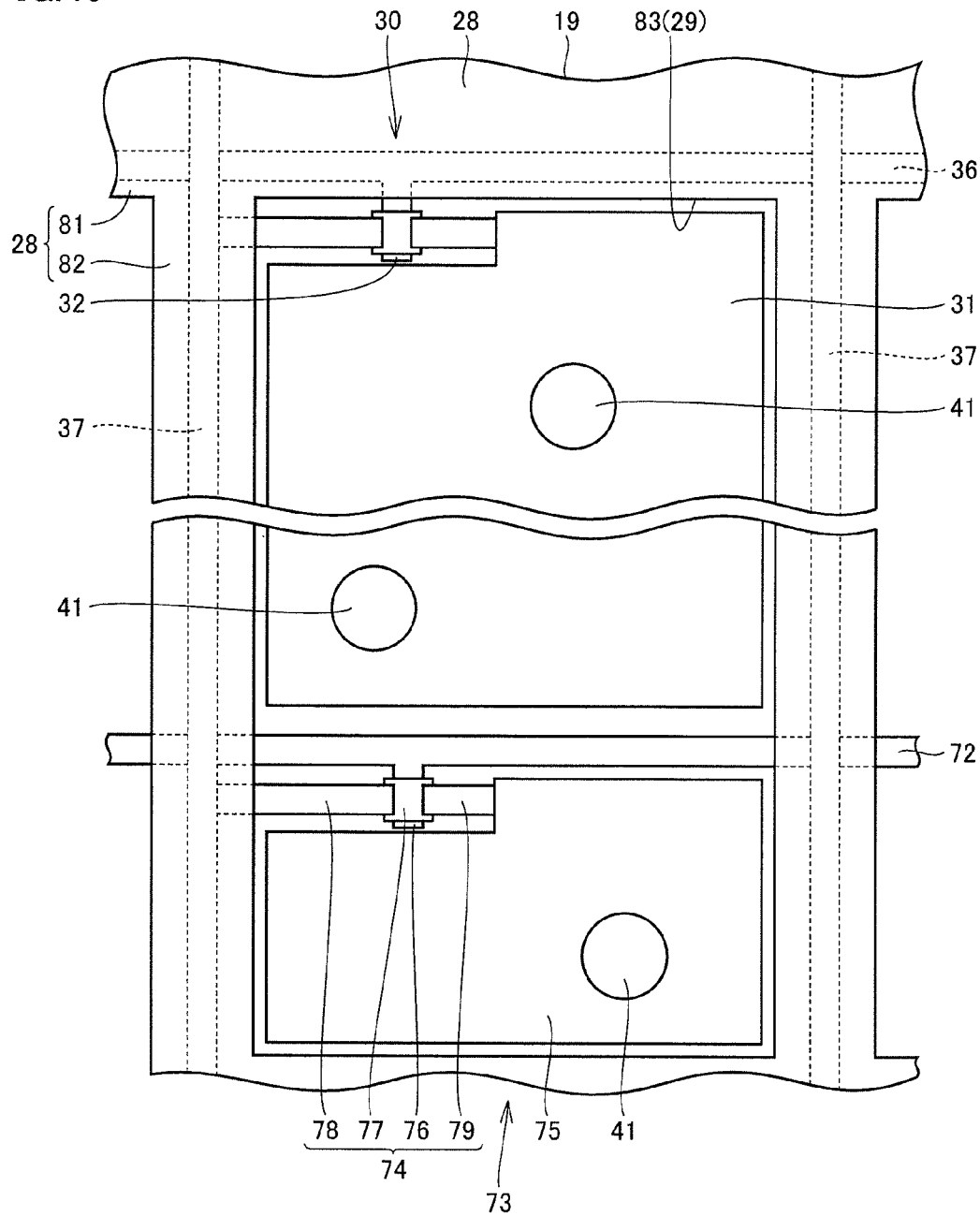
FIG. 45 is a plan view of display device 10 according to a sixth embodiment.

FIG. 45 is a plan view of display device 10 according to the sixth embodiment. As shown in FIG. 45, again in display device 10 according to the sixth embodiment, sensor elements 73 are formed in the display area.

An electrical circuit of display device 10 according to the sixth embodiment is the same as that shown in FIG. 34.

Figure 46:
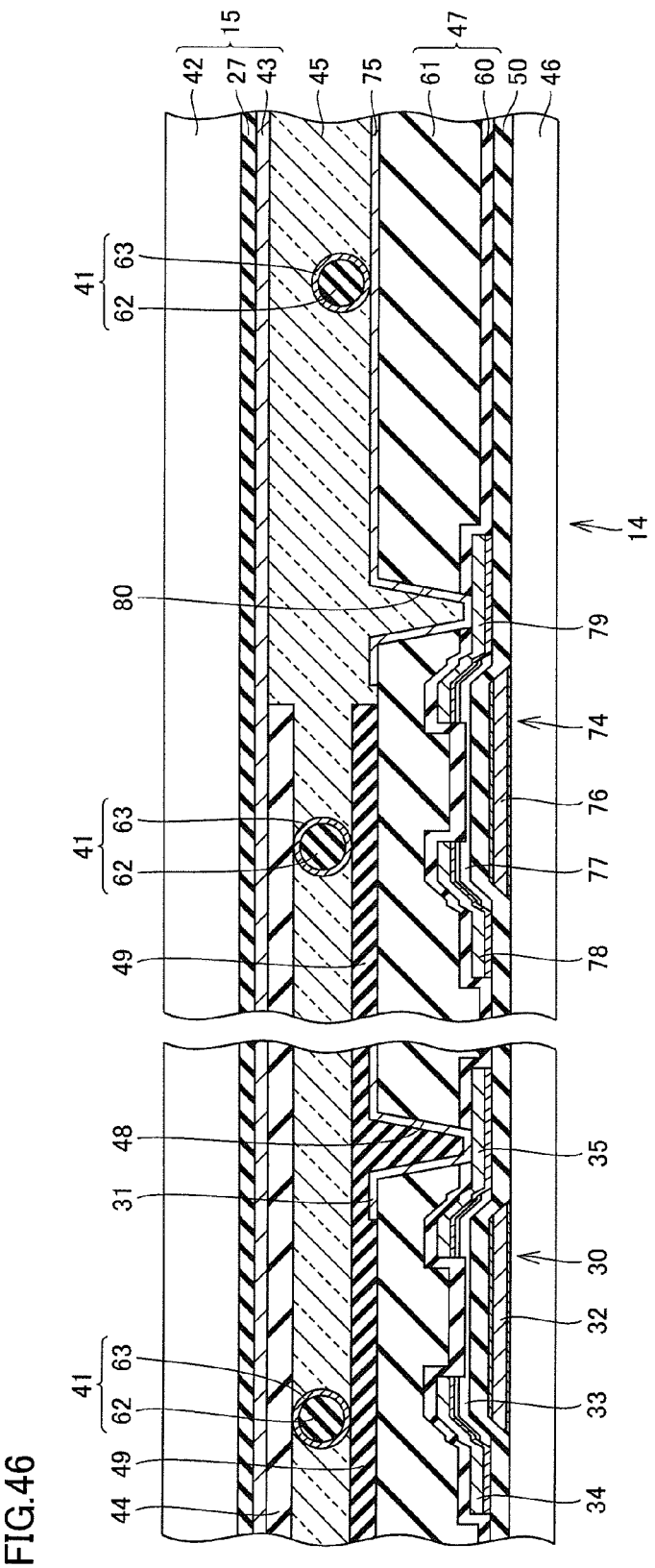
FIG. 46 is a cross-sectional view of display device 10 according to the sixth embodiment.

FIG. 46 is a cross-sectional view of display device 10 according to the sixth embodiment. As shown in FIG. 46, at least a part of lower electrode 75 is exposed through alignment film 49. Conductive particle 41 is arranged on the upper surface of lower electrode 75 which is exposed through alignment film 49. A portion of the lower surface of counter electrode 43 which is opposite to lower electrode 75 is exposed through alignment film 44.

Conductive particles 41 are arranged on the upper surface of alignment film 49, and each conductive particle 41 has an upper end portion in contact with alignment film 44 of counter substrate 15.

Conductive particles 41 arranged on the upper surface of alignment film 44 and making contact with alignment film 44 function as holding members for maintaining the gap between counter substrate 15 and active matrix substrate 14.

When the user presses the upper surface of counter substrate 15, conductive particles 41 arranged on the upper surface of alignment film 49 are elastically deformed and counter substrate 15 sags, causing conductive particle 41 positioned on the upper surface of lower electrode 75 to come into contact with counter electrode 43.

When a prescribed voltage is applied to gate electrode 76 of selection transistor 74, an inversion layer is formed in semiconductor layer 77. Source electrode 78 is connected to sensor driver 26 shown in FIG. 34, which is connected to control unit 70.

Control unit 70 applies a prescribed voltage to gate electrode 76 of selected selection transistor 74. When selected selection transistor 74 is turned on and the upper end portion of conductive particle 41 comes into contact with counter electrode 43, a current flows successively through counter electrode 43, conductive particle 41, lower electrode 75, the inversion layer, source electrode 78 and sensor driver 26, to reach control unit 70. Control unit 70 can sense that counter substrate 15 has been pressed, and identify the pressed position.

Figure 47:
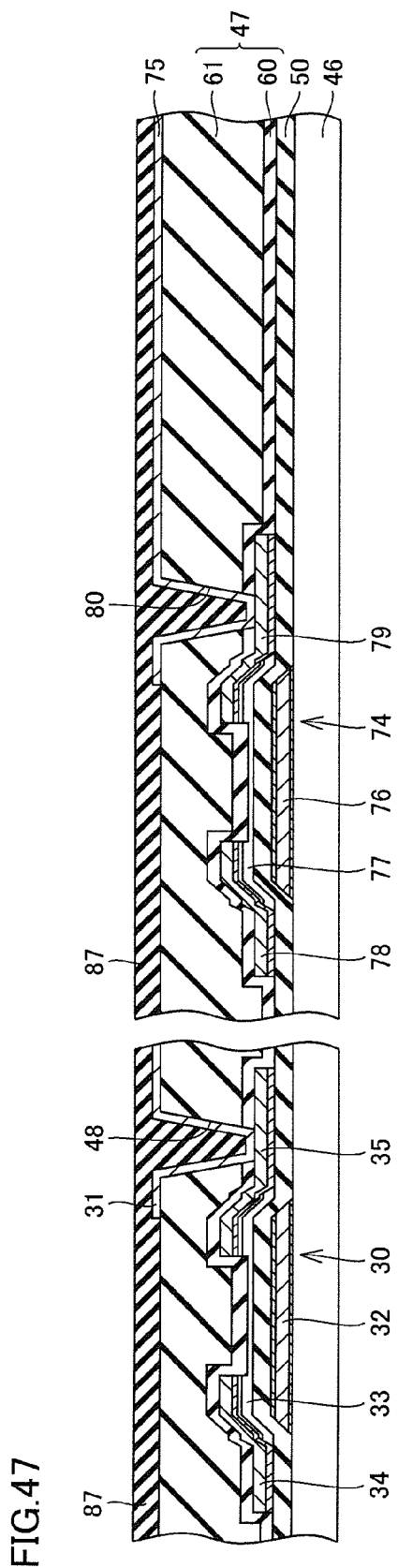
FIG. 47 is a cross-sectional view showing a manufacturing step of display device 10 according to the sixth embodiment.
Figure 48:
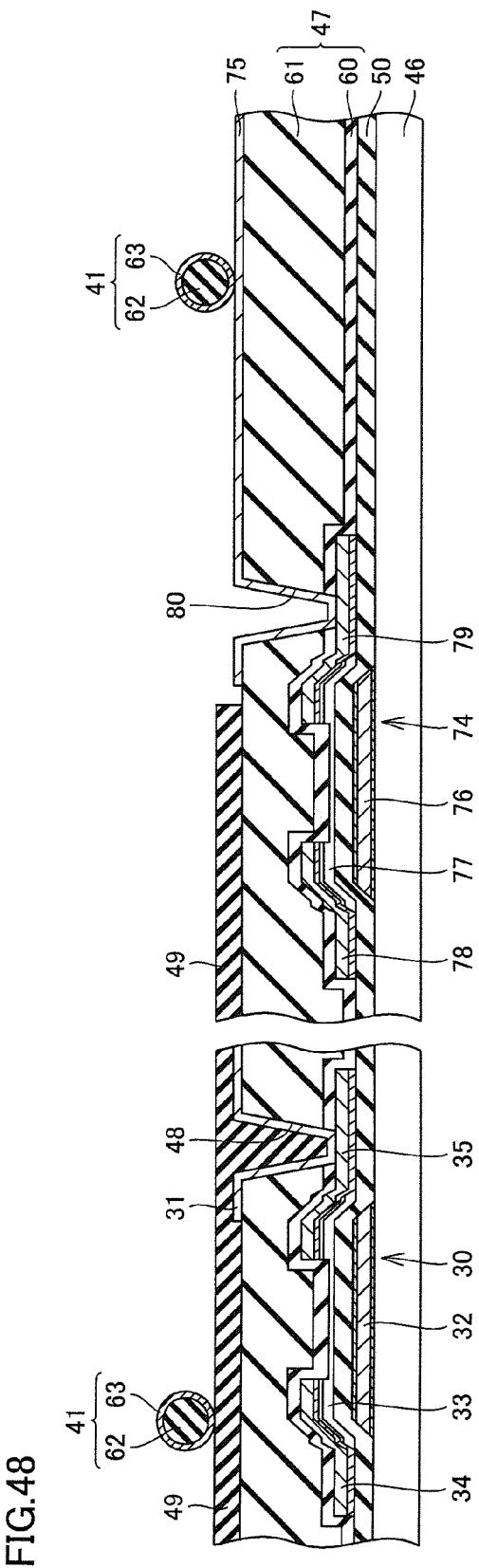
FIG. 48 is a cross-sectional view showing a manufacturing step subsequent to the manufacturing step shown in FIG. 47.

Referring to FIGS. 47 and 48, a method of manufacturing display device 10 having the structure as described above is described.

FIG. 47 is a cross-sectional view showing a manufacturing step of display device 10 according to the sixth embodiment. FIG. 47 shows a manufacturing step subsequent to the manufacturing step shown in FIG. 17.

As shown in FIG. 46, a polyimide film 87 is formed on the upper surface of interlayer insulating film 47 to cover pixel electrode 31 and lower electrode 75.

Next, as shown in FIG. 47, polyimide film 87 is formed on interlayer insulating film 47 to cover pixel electrode 31 and lower electrode 75.

Next, polyimide film 87 is patterned to expose at least a part of lower electrode 75 through polyimide film 87. Polyimide film 87 is then subjected to a rubbing process and the like, to form alignment film 49.

After alignment film 49 is formed, the plurality of conductive particles 41 are distributed on the upper surface of active matrix substrate 14. Some of distributed conductive particles 41 are arranged on the upper surface of alignment film 49, and others are arranged on the upper surface of lower electrode 75.

Next, as shown in FIG. 48, counter substrate 15 having alignment film 44 formed thereon is bonded to the upper surface of active matrix substrate 14. Here, the upper end portions of conductive particles 41 positioned on alignment film 49 come into contact with alignment film 44, so that conductive particles 41 maintain the gap between counter substrate 15 and active matrix substrate 14. On the other hand, there is a clearance between the upper end portion of conductive particle 41 positioned on lower electrode 75 and counter electrode 43 of counter substrate 15.

Then, steps similar to those of the manufacturing steps of display device 10 according to the first embodiment are performed, thereby assembling display device 10 according to the sixth embodiment.

In the first to sixth embodiments, operation area 23 is positioned inside a region surrounded by sealing member 39. Thus, liquid crystal layer 45 fills the area around conductive particles 41 and lower electrode 38. Filling the area around conductive particles 41 and lower electrode 38 with liquid crystal layer 45 is not necessarily essential, however. Namely, operation area 23 may be arranged outside of the region surrounded by sealing member 39.

Seventh Embodiment

Figure 49:
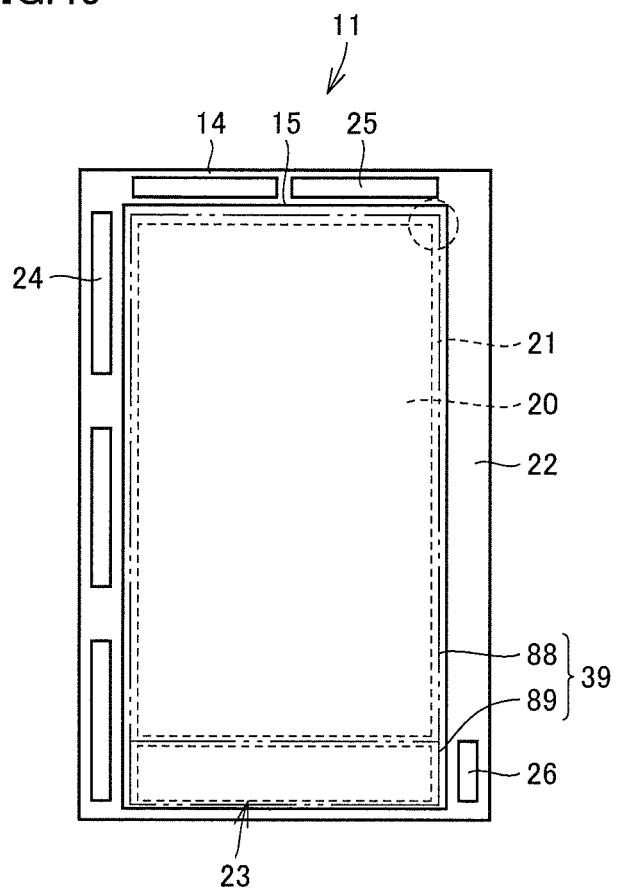
FIG. 49 is a plan view of display unit 11.
Figure 50:
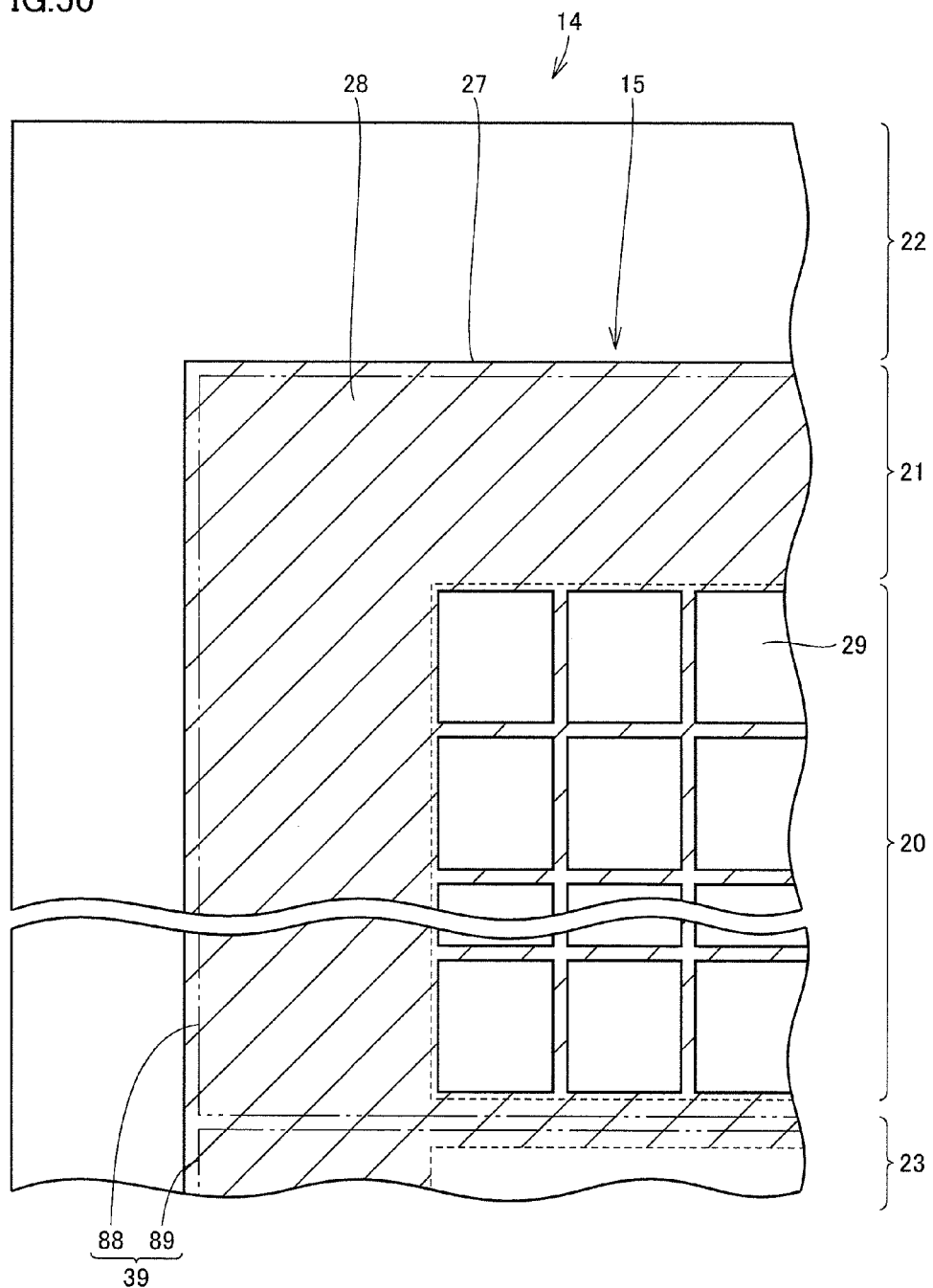
FIG. 50 is a plan view showing an enlarged part of display unit 11, where, as shown in FIG. 50, a display area sealing member 88 is arranged between a display area 20 and operation area 23.
Figure 51:
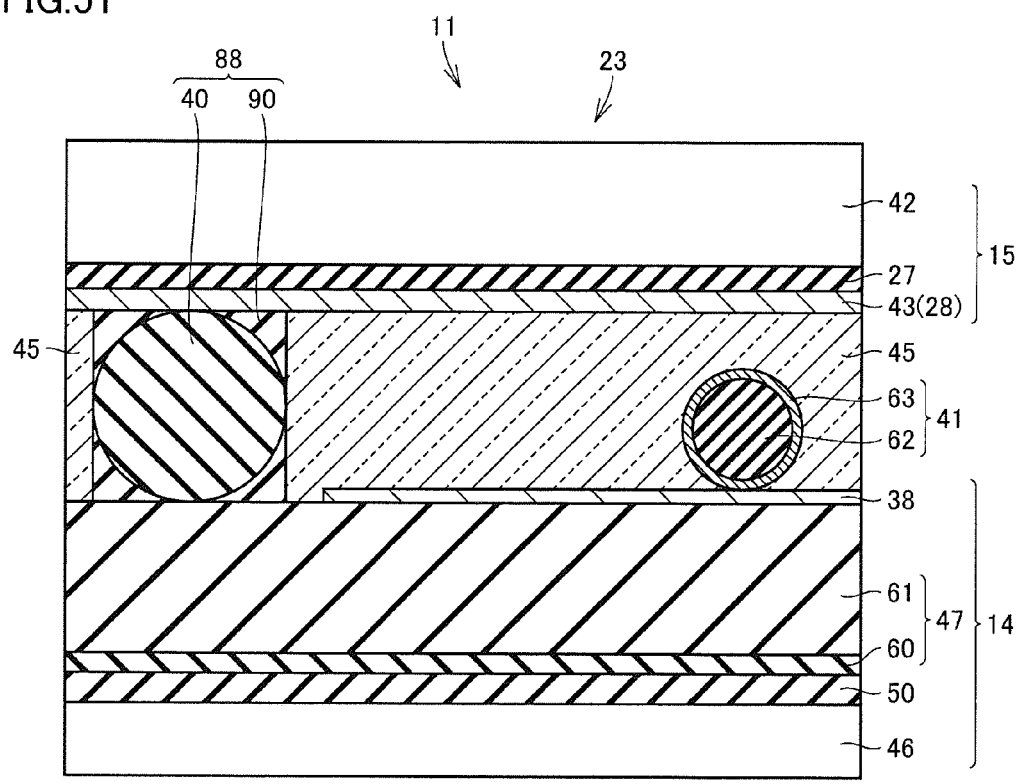
FIG. 51 is a cross-sectional view of display device 10 according to a seventh embodiment.

Referring to FIGS. 49 to 51, display device 10 according to a seventh embodiment is described. In FIGS. 49 to 51, elements the same as or corresponding to those in FIGS. 1 to 48 may not be described. FIG. 49 is a plan view of display unit 11. As shown in FIG. 49, sealing member 39 includes a display area sealing member 88 formed to surround display area 20, and an operation area sealing member 89 formed to surround operation area 23. FIG. 50 is a plan view showing an enlarged part of display unit 11, where, as shown in FIG. 50, display area sealing member 88 is arranged between display area 20 and operation area 23.

FIG. 51 is a cross-sectional view of display device 10 according to the seventh embodiment. As shown in FIG. 51, display area sealing member 88 includes a sealing main body portion 90, and spacer ball 40 provided in sealing main body portion 90. Display area 20 positioned on the inner side of display area sealing member 88 is filled with liquid crystal layer 45, and operation area 23 is not filled with liquid crystal layer 45. In this manner, lower electrode 38 and conductive particles 41 are arranged on the outer side of display area sealing member 88, and liquid crystal layer 45 is not provided around lower electrode 38 and conductive particles 41.

Although the embodiments of the present invention have been described above, it should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims. In addition, the numerical values and the like are illustrative, and the present invention is not limited to the numerical values and ranges.

INDUSTRIAL APPLICABILITY

The present invention is applicable to a display device and a method of manufacturing the display device, and is particularly suitable for a display device with a touch panel function and a method of manufacturing the display device.

REFERENCE SIGNS LIST 10 display device; 11 display unit; 12 backlight; 13 housing; 14 active matrix substrate; 15 counter substrate; 16 front surface unit; 17 opening; 18 rear surface unit; 19 color filter; 20 display area; 21 non-display area; 22 connection area; 23 operation area; 24 gate driver; 25 source driver; 26 sense driver; 27 color driver; 28 black matrix; 29 color layer; 30 transistor; 31 pixel electrode; 32, 76 gate electrode; 33, 77 semiconductor layer; 34, 78 source electrode; 35, 79 drain electrode; 36 gate line; 37 source line; 38 lower electrode; 39 sealing member; 40 spacer ball; 41 conductive particle; 42, 46 glass substrate; 43 counter electrode; 44, 49 alignment film; 45 liquid crystal layer; 47 interlayer insulating film; 48, 80 contact hole; 50 tunnel insulating film; 51 to 53 metallic film; 54 high-resistance semiconductor layer; 56 to 59 metallic layer; 60 protective film; 61 flattened film; 62 core portion; 63 conductive film; 64, 67 insulating film; 65 support member; 66, 75 lower electrode; 68 opening; 69 switch; 70 control unit; 71 printing line; 72 sensor line; 73 sensor element; 74 selection transistor; 81, 82 beam portion; 83 window portion; 84 resist; 85 resist solvent; 86 bonding layer; 87 polyimide film; 88 display area sealing member; 89 operation area sealing member; 90 sealing main body portion.

The invention claimed is:

1. A display device comprising:
   a first substrate;
   a second substrate arranged at a distance from and opposite to said first substrate;
   a first electrode formed on said first substrate;
   a second electrode formed on said second substrate opposite to said first electrode;
   a support member for supporting said first substrate and said second substrate to maintain a gap between said first substrate and said second substrate; and
   a plurality of conductive members in particulate form arranged between said first substrate and said second substrate,
   a clearance being provided between said conductive members positioned on said first electrode and said second electrode,
   said conductive members positioned on said first electrode being able to come into contact with said second electrode when said second substrate is pressed.

2. The display device according to claim 1, wherein each of said conductive members includes an elastically deformable core portion, and a conductive film covering a surface of said core portion.

3. The display device according to claim 1, wherein said support member is an insulating member in particulate form arranged between said first substrate and said second substrate, said insulating member having a particle size larger than that of said conductive members.

4. The display device according to claim 1, further comprising a first insulating film formed on said first substrate to expose at least a part of said first electrode, wherein said conductive members include a first conductive member arranged on the part of said first electrode which is exposed through said first insulating film, and arranged at a distance from said second electrode, and a second conductive member arranged on said first insulating film, and supporting said first substrate and said second substrate, said support member includes said first insulating film and said second conductive member, and said first conductive member is able to come into contact with said second electrode when said second substrate is pressed.

5. The display device according to claim 4, wherein said first insulating film is an alignment film provided on said first substrate.

6. The display device according to claim 1, further comprising a second insulating film formed on said second substrate to expose at least a part of said second electrode, wherein said conductive members include a third conductive member positioned below the part of said second electrode which is exposed through said second insulating film, and arranged on said first electrode, and a fourth conductive member arranged between said second insulating film and said first substrate, and supporting said first substrate and said second substrate, said support member includes said second insulating film and said fourth conductive member, and said third conductive member is able to come into contact with said second electrode when said second substrate is pressed.

7. The display device according to claim 1, wherein said conductive members arranged on said first electrode are fixed on said first electrode.

8. The display device according to claim 1, further comprising a color filter having a light-blocking black matrix and a color layer, wherein said first electrode and said black matrix are arranged in a direction in which said first substrate and said second substrate are stacked.

9. The display device according to claim 1, further comprising an active matrix substrate having said first substrate and said first electrode, wherein said active matrix substrate includes a display area provided with a plurality of switching elements, and a non-display area, and said first electrode and said conductive members are provided in said display area.

10. The display device according to claim 1, further comprising an active matrix substrate having said first substrate and said first electrode, wherein said active matrix substrate includes a display area provided with a plurality of switching elements, and a non-display area, and said first electrode and said conductive members are provided in said non-display area.

11. The display device according to claim 1, further comprising:

a liquid crystal layer arranged between said first substrate and said second substrate; and a sealing member arranged between said first substrate and said second substrate and sealing said liquid crystal layer between said first substrate and said second substrate, wherein said first electrode and said conductive members are arranged in a region surrounded by said sealing member.

12. The display device according to claim 1, further comprising:

a liquid crystal layer arranged between said first substrate and said second substrate; and a sealing member arranged between said first substrate and said second substrate and sealing said liquid crystal layer between said first substrate and said second substrate, wherein said first electrode and said conductive members are arranged outside of said sealing member.

13. A method of manufacturing the display device according to claim 1, comprising the steps of:

preparing said first substrate having a first main surface;

forming said first electrode on said first main surface;

preparing said second substrate having a second main surface;

forming said second electrode on said second main surface;

arranging said conductive members in particulate form on said first substrate having said first electrode formed thereon, so that said conductive members are arranged on said first electrode; and bonding said first substrate and said second substrate together so that said first main surface and said second main surface are opposite to each other, wherein said conductive members arranged on said first electrode being arranged at a distance from said second electrode when said first substrate and said second substrate are bonded together.

14. The method of manufacturing the display device according to claim 13, wherein said step of arranging said conductive members includes the steps of applying a solvent having said conductive members mixed therein to said first substrate, and patterning said solvent applied to said first substrate to form a pattern film remaining on said first electrode.

15. The method of manufacturing the display device according to claim 13, further comprising the steps of:

forming a resist film on said first substrate having said first electrode formed thereon; and patterning said resist film to form a resist pattern film provided with an opening through which at least a part of said first electrode is exposed, wherein said step of arranging said conductive members includes the steps of distributing said conductive members so that said conductive members are positioned in said opening and on said resist pattern film, fixing said conductive members positioned in said opening onto said first electrode, and removing said resist pattern film and said conductive members positioned on said resist pattern film.

16. The method of manufacturing the display device according to claim 15, wherein each of said conductive members includes a resin layer provided on its surface, and a conductive layer positioned on the inner side of said resin layer, and said step of fixing said conductive members includes the step of heating said conductive members positioned in said opening.

17. The method of manufacturing the display device according to claim 13, further comprising the steps of:

forming a first insulating film on said first substrate having said first electrode formed thereon; and patterning said first insulating film to form a first pattern insulating film provided with an opening through which at least a part of said first electrode is exposed, wherein in said step of arranging conductive members, said conductive members are arranged in said opening and on said first pattern insulating film.

18. The method of manufacturing the display device according to claim 17, further comprising the step of subjecting said first pattern insulating film to a rubbing process to form an alignment film.

19. The method of manufacturing the display device according to claim 13, further comprising the steps of:
  forming a second insulating film on said second electrode; and
  patterning said second insulating film to expose a part of said second electrode.

* * * * *